United States Patent
Mehta et al.

(10) Patent No.: US 11,137,458 B2
(45) Date of Patent: Oct. 5, 2021

(54) HIGH-TEMPERATURE NMR MAS PROBE WITH OPTIMIZED TEMPERATURE GRADIENT ACROSS SAMPLE ROTOR

(71) Applicant: Battelle Memorial Institute, Richland, WA (US)

(72) Inventors: Hardeep S. Mehta, Richland, WA (US); Jesse A. Sears, Jr., Kennewick, WA (US); Eric D. Walter, West Richland, WA (US); Nancy M. Washton, Richland, WA (US); Karl T. Mueller, Richland, WA (US); Ying Chen, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 16/888,374

(22) Filed: May 29, 2020

(65) Prior Publication Data

US 2020/0379065 A1    Dec. 3, 2020

Related U.S. Application Data

(60) Provisional application No. 62/853,834, filed on May 29, 2019.

(51) Int. Cl.
*G01R 33/31*    (2006.01)
*G01R 33/30*    (2006.01)
(Continued)

(52) U.S. Cl.
CPC .......... *G01R 33/31* (2013.01); *G01N 24/088* (2013.01); *G01R 33/307* (2013.01); *G01R 33/46* (2013.01)

(58) Field of Classification Search
CPC ...... G01R 33/31; G01R 33/307; G01R 33/46; G01N 24/088
See application file for complete search history.

(56) References Cited

U.S. PATENT DOCUMENTS 4,511,841 A    4/1985  Bartuska et al.
4,739,270 A    4/1988  Daugaard et al.
(Continued)

FOREIGN PATENT DOCUMENTS

WO    WO2009/012504 A2    1/2009

OTHER PUBLICATIONS

Bruker BioSpin AG, "NMR Probes—Variable Temperature Control for NMR Probes User Manual," Version 002, Jun. 28, 2012, 100 pages.
(Continued)

*Primary Examiner* — G. M. A Hyder
(74) *Attorney, Agent, or Firm* — Klarquist Sparkman, LLP

(57) ABSTRACT

A rotor housing assembly for NMR spectroscopy. An elongate rotor has a distal drive end, a proximal end and an internal sample space positioned along its length between the drive and proximal ends. The rotor is driveable about a rotation axis by a drive gas flow. A rotor housing has an interior space in which the rotor is at least partially received. At least one first heated gas flow inlet is positioned opposite the internal sample space, through which a first heated gas flow is controllably flowable into the interior space to heat it and the rotor. At least a pair of spaced apart second heated gas flow outlets are axially spaced from the first heated gas flow inlet to controllably convey a second heated gas flow to heat distal and proximal areas of the sample space to minimize a temperature gradient extending axially within the sample space.

26 Claims, 20 Drawing Sheets

(51) Int. Cl.
*G01R 33/46* (2006.01)
*G01N 24/08* (2006.01)

(56) References Cited

U.S. PATENT DOCUMENTS

| | | | |
|---|---|---|---|
| 5,192,910 A * | 3/1993 | Hepp | B01L 7/00 |
| | | | 324/315 |
| 5,202,633 A | 4/1993 | Doty et al. | |
| 5,517,856 A | 5/1996 | Hofmann et al. | |
| 6,812,706 B2 | 11/2004 | Leung et al. | |
| 8,692,548 B2 | 4/2014 | Hoyt et al. | |
| 2011/0284192 A1 * | 11/2011 | Grossniklaus | G01R 33/31 |
| | | | 165/135 |

OTHER PUBLICATIONS

F. David Doty, "Solid State NMR Probe Design," Encyclopedia of Magnetic Resonance, www.interscience.wiley.com, Dec. 15, 2007, 21 pages.

Gan et al., "NMR Spectroscopy Up to 35.2 T Using a Series-Connected Hybrid Magnet," *J Magn Reson*, Nov. 2017, 284: pp. 125-136.

Revolution NMR, LLC, "Revolution NMR manufacture and service wide bore solid state NMR probes and consumables," *TalaveraScience*, www.talaverascience.com/tsRevolution.html, Apr. 20, 2020, 7 pages.

Wilmad-LabGlass, "Spinner Turbine for Bruker and Agilent (Varian) spectrometers," Product Brochure, Printed Apr. 20, 2020, 2 pages.

* cited by examiner

FIG. 20A
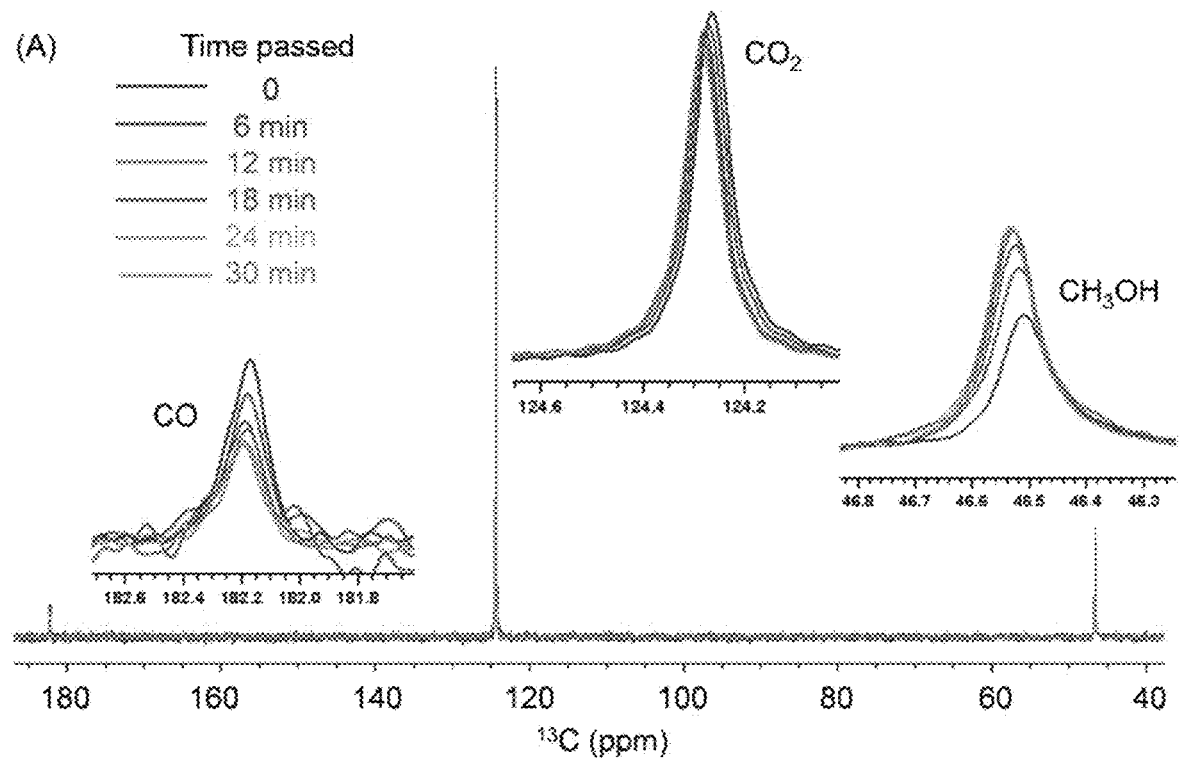
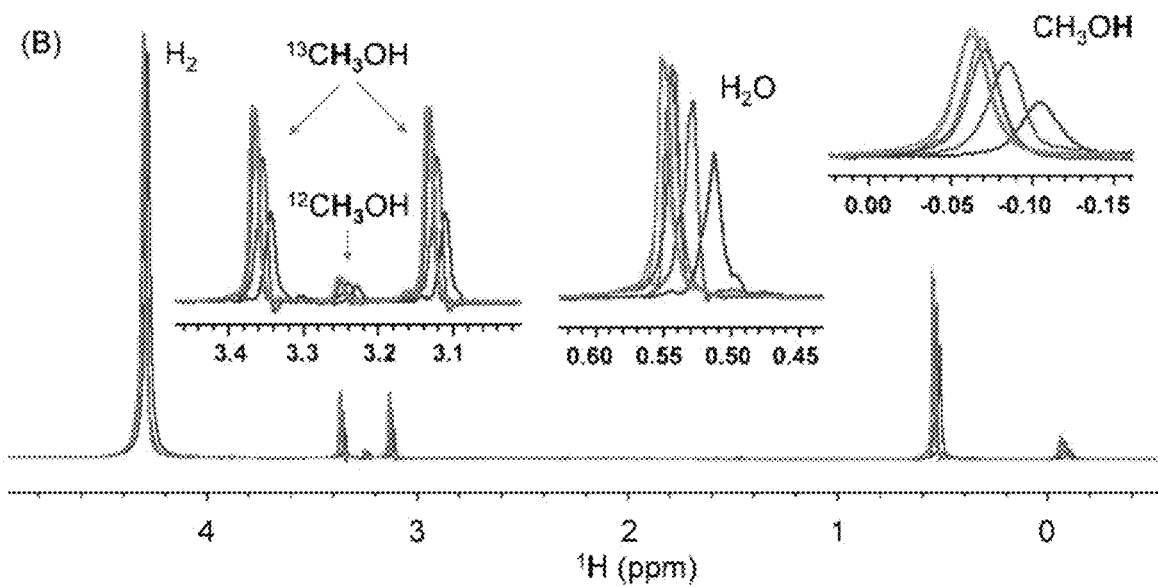
FIG. 20B

FIG. 21A
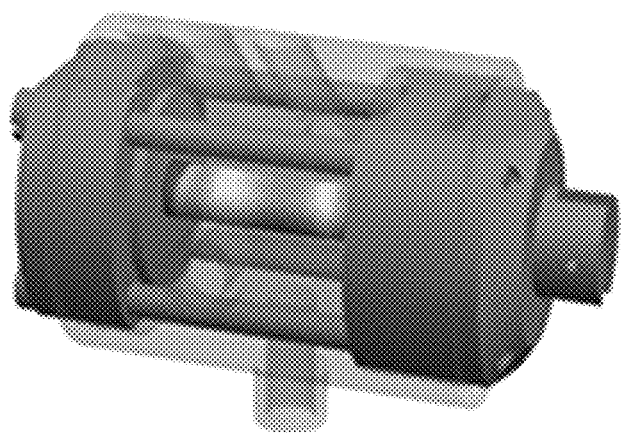
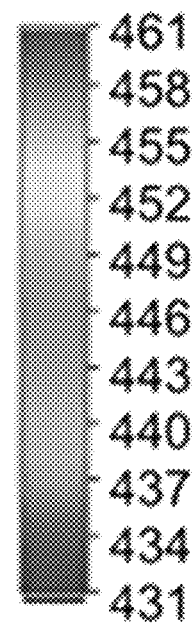
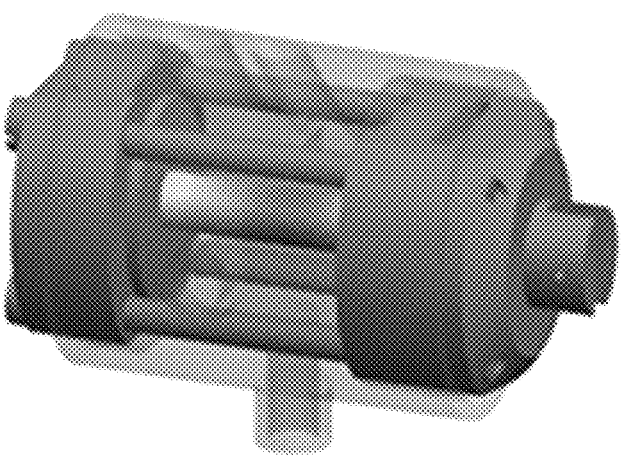
FIG. 21B

HIGH-TEMPERATURE NMR MAS PROBE WITH OPTIMIZED TEMPERATURE GRADIENT ACROSS SAMPLE ROTOR

CROSS REFERENCE TO RELATED APPLICATION

This application claims the benefit of U.S. Provisional Patent Application No. 62/853,834, filed May 29, 2019, which is hereby incorporated by reference.

STATEMENT AS TO RIGHTS TO DISCLOSURES MADE UNDER FEDERALLY-SPONSORED RESEARCH AND DEVELOPMENT

This disclosure was made with Government support under Contract DE-AC0576RL01830 awarded by the U.S. Department of Energy. The Government has certain rights in the invention.

BACKGROUND

In the field of nuclear magnetic resonance (NMR) spectroscopy, several key spectral parameters are impacted by sample temperature. These include spin-lattice relaxation ($T_1$), spin-spin relaxation ($T_2$), line width, chemical shift and diffusion rates. A temperature gradient across the sample in a magic angle spinning (MAS) experiment will adversely affect the resolution of the spectra, and the validity of the subsequent analysis, especially for critical temperature regimes where phase transitions occur or when studying the rates of a chemical reactions. Minimizing and controlling temperature gradients in a MAS rotor for high resolution solid-state NMR experiments is usually challenging due to inhomogeneous heating, inefficient heat transfer, heating effects from high-power radiofrequency radiation, and cooling effects from the high flow rates of the driving and bearing gas.

Commercial solids MAS NMR probes with a temperature range up to 250° C. are available from Bruker, Doty Scientific, Revolution NMR and Phoenix NMR. Conventionally, MAS experiments above 250° C. can be achieved by three methods: laser heating, inductive heating, and hot gas heating. The Bruker LASERMAS system uses a laser beam fed through an optical fiber to achieve a temperature jump up to 900° C. within several seconds, but the spatial temperature distribution across the sample is significant due to the intense laser heating. Another way of reaching temperature jumps of up to 700° C. is to perform radio frequency inductive heating, which involves using specialized rotors with platinum layers coated on an outer side thereof or on platinum metal inserts positioned inside rotors. The Doty HT probe uses hot nitrogen gas streams to obtain a sample temperature of 700° C., but requires a specialized high temperature-stable MAS assembly to prevent heat transfer to the magnet. Conventionally, Varian-style rotor housings rely on a heated VT gas stream, which is directed to flow inwardly towards the center, at an approximate midpoint along the rotor's length, to accomplish VT heating, while the bearing and drive gas streams are at room temperature. This results in a temperature gradient, extending from the center of the sample towards each end of the rotor, which detracts from the results that can be achieved.

SUMMARY

Described below are implementations of an NMR probe system, components thereof and related methods that minimize the temperature gradient across the sample for VT experiments up to 400° C. by controllably heating the bearing gas flow and/or the drive gas flow, in addition to the VT gas flow. In most implementations, no expensive specialized rotors or inserts are required, and the designs can be adapted to any rotor size and commensurate spin rate. Also, the probe, components and methods are compatible with MAS WHiMS rotors previously developed by the present assignee, which are pressurized rotors capable of holding pressures up to 400 bar at room temperature. Thus, in-situ NMR studies for mixed-phase reactions have now been carried out that were previously not possible with conventional NMR probe systems.

According to one implementation, a rotor housing assembly for holding and spinning a sample during NMR spectroscopy comprises an elongate rotor and a housing. The elongate rotor has a distal drive end, a proximal end and an internal sample space positioned along the rotor length between the drive end and the proximal end. The rotor is driveable to rotate about a rotation axis by a drive gas flow. The housing has a housing interior space in which at least a portion of the rotor is received. At least one first heated gas flow inlet is positioned in the housing and opposite the internal sample space of the rotor. A first heated gas flow from a first gas source is controllably flowable through the first heated gas flow inlet and into the interior space of the housing to heat the interior space and the rotor. At least a pair of spaced apart second heated gas flow outlets are axially spaced from the first heated gas flow inlet and positioned towards the distal drive and proximal ends of the rotor, respectively. A second heated gas flow from a second gas source through the second heated gas flow outlets is controllable to heat distal and proximal areas of the sample space within the rotor to minimize a temperature gradient extending axially within the sample space.

The rotor housing assembly can include proximal and distal air bearing areas in the housing positioned to receive air bearings for rotatably supporting the rotor, and the second heated gas flow outlets can be configured to direct the second heated gas flow towards the proximal and distal air bearing areas, respectively. The first heated gas flow can comprise a heated variable temperature (VT) gas flow. The second heated gas flow can comprise a heated bearing gas flow.

In some implementations, the drive gas flow is unheated. In some implementations, the drive gas flow is heated (either instead of providing a heated bearing gas flow or in addition to providing a heated bearing gas flow). In some implementations, the drive gas flow can be heated to 200° C. (and potentially to even higher temperatures, even as high as 350° C. or 400° C., provided other constraints, such as the temperature resistance of rotor assembly components, are addressed). As a result of heating the drive gas flow to high temperatures such as 200° C., the results are expected to show greater flexibility in controlling the temperature gradient of the sample (either of instead of or in addition to bearing gas flow heating).

In some implementations, the temperature gradient within the sample space is 3° C. or less from an area of the sample space opposite the first heated gas flow inlet (which may be, e.g., near a middle of the sample space, in some implementations) extending axially toward a cooler one of the proximal and distal areas (which may be, e.g., the ends of the sample space, in some implementations). In typical implementations for which the temperature gradient within the sample space was 3° C. or less, the sample space has a total length between its ends of 12-15 mm.

In some implementations, the first heated gas flow is heated to a temperature of up to 400° C. In some implementations, the second heated gas flow is heated to a temperature of up to 200° C. (and potentially even higher temperatures, provided other constraints, such as the temperature resistance of rotor assembly components, are addressed).

In a some implementations, a flow path for the second heated gas flow comprises an inlet passage formed in a wall of the housing, a junction with one distally extending passage and one proximally extending passage, the distally extending passage and the proximally extending passage each terminating at a respective one of the second heated gas flow outlets.

In some implementations, there are proximal and distal air bearings positioned to rotatably support the rotor, and the second heated gas flow outlets are positioned adjacent the proximal and distal air bearings, respectively. The second heated gas flow can comprise a heated bearing gas flow that supplies the proximal and distal air bearings and transfers heat from along the flow path and through the wall, and from the proximal and distal air bearings into the housing interior space.

In some implementations, the rotor housing assembly also includes a dewar with a heating coil connected to supply the second heated gas flow to the inlet passage in the wall of the housing assembly.

In some implementations, the rotor assembly also includes a surrounding shell having an exhaust opening, and the first heated gas flow and the second heated gas flow are exhausted from the housing into the shell. There is also a purge air flow pathway by which a purge air flow of cooling air is directed into the shell to mix with and cool exhausted first and second gas flows before they are exhausted from the shell. The shell can have an annular space by which air from an electronics area is exhausted.

In some implementations, the internal sample space of the rotor is capable of being pressurized up to 400 bar.

According to a method implementation, a method of operating an NMR probe at elevated temperatures includes flowing a drive flow gas to impinge upon a drive end of a rotor having a sample space to drive the rotor in rotation about an axis, the drive flow gas being fed through a passage in a housing positioned radially outwardly of the rotor; flowing a first heated gas flow through an opening in the housing and towards the sample space of the rotor, and flowing a second heated gas flow in opposite directions toward opposite ends of the rotor, wherein the first heated gas flow and the second heated gas flow are controllable to reduce a temperature gradient extending axially along the sample space of the rotor. In some implementations, the temperature gradient extending axially along the sample space is 3° C. or less.

In some implementations, the second heated gas flow comprises a bearing gas flow directed to air bearing areas to operate air bearings at opposite ends of the rotor to support the rotor during rotation.

In some implementations, the method includes heating the first heated gas stream to an elevated temperature of up to 400° C. In some implementations, the method includes heating the second heated gas stream to an elevated temperature of up to 200° C. In some implementations, the method includes heating the drive gas flow to assist in reducing the temperature gradient in the sample space.

According to another method implementation, a method of in situ monitoring of a high temperature MAS NMR process includes pressurizing a sample space within a rotor to 60 bar, spinning the rotor to conduct a MAS NMR operation and heating the pressurized sample space within the rotor to a temperature above 250° C., maintaining a temperature gradient within the sample space of 3° C. or less, and monitoring in situ phase transitions.

The foregoing and other objects, features, and advantages of the invention will become more apparent from the following detailed description, which proceeds with reference to the accompanying figures.

BRIEF DESCRIPTION OF THE DRAWINGS

FIGS. 20A and 20B are graphs of $^{13}$C and $^{1}$H MAS NMR spectra collected every six minutes for a mixture of $CO_2$ and $H_2$ with a Cu/ZnO/$Al_2O_3$ catalyst at 325° C. under 60 bar 1:2 $CO_2$:$H_2$.

FIGS. 21A and 21B are perspective schematic views of a rotor housing showing that the temperature gradient in the sample area is reduced when bearing flow heating is provided compared to operation with no bearing flow heating.

DETAILED DESCRIPTION OF PREFERRED EMBODIMENTS

Figure 1:
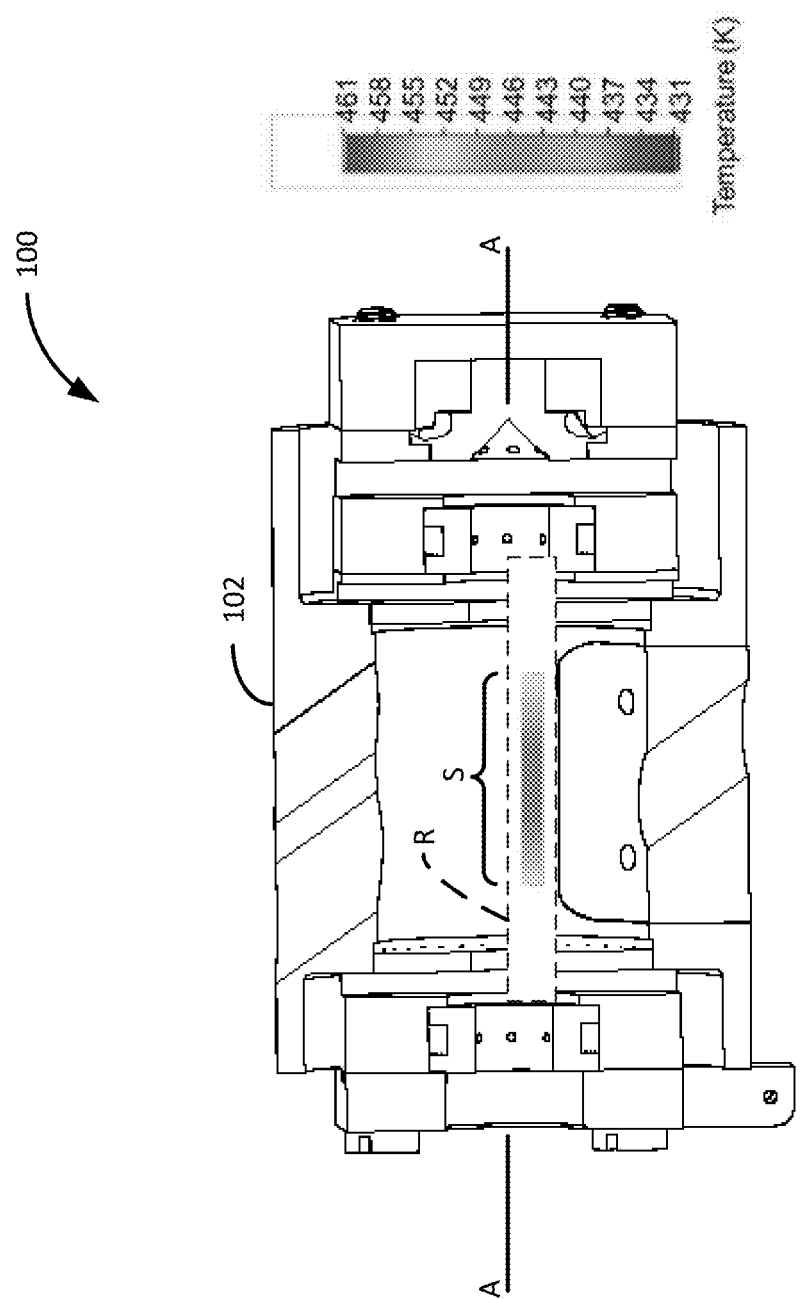
FIG. 1 is a section view in elevation of a rotor housing assembly for an NMR probe controlled to provide a reduced temperature gradient over a sample section of the rotor, which is shown schematically.

Described below are implementations of a new nuclear magnetic resonance (NMR) probe design that achieves a reduced (or otherwise optimized) temperature gradient across the sample for high temperature MAS experiments, while permitting use of standard rotors, drive tips and end caps. Heating the bearing gas stream (or flow) along with the traditional variable gas stream (or flow) enables achieving a temperature gradient of less than 3° C. across the sample. In other implementations, the drive gas stream (or flow) can also be heated. The new probe also allows the use of standard, commercially available rotor housings for sample temperatures up to 400° C. Further, the probe design is compatible with high pressure WHiMS rotors, such as are disclosed in U.S. Pat. No. 8,692,648, which is incorporated herein by reference. As is described in further detail below, time-resolved $^{13}C$ and $^1H$ MAS NMR experimental results performed at 325° C. and 60 bar to monitor an in-situ mixed phase reverse water gas shift reaction (industrial synthesis of $CH_3OH$ from a mixture of $CO_2$ and $H_2$ with a $Cu/ZnO/Al_2O_3$ catalyst) are presented. This result is believed to be the first in-situ NMR monitoring of a chemical system at temperatures higher than 250° C. in a pressurized environment. In a first implementation, an exemplary rotor housing assembly 100 as shown in FIG. 1 for use with an NMR probe has a conventional rotor R with an internal sample space S in which a reduced temperature gradient, which is measured from an approximate midpoint of the rotor and extends axially outward in opposite directions along a rotational axis A towards each end of the rotor (shown schematically in the temperature profile), has been achieved compared to conventional approaches. Computational flow dynamics (CFD) simulations were used to assess and control or optimize the temperature gradient across the sample under MAS conditions. The chemical shift and linewidth of $^{207}Pb$ direct polarization in lead nitrate were used to calibrate the sample temperature and temperature gradient, respectively. A temperature gradient of less than 3° C. across the sample was obtained by heating the bearing gas flow (at both ends) and adjusting its temperature and flow rate during variable temperature (VT) experiments. In typical implementations described herein for which the temperature gradient within the sample space was 3° C. or less, the sample space had a total length between its ends of 12-15 mm.

Repeated tests were conducted at a maximum temperature of 350° C. in this probe, which was a high temperature limit observed when using a Varian 5 mm MAS rotor with standard Vespel drive tips and end caps. Some additional testing was conducted at 365° C., and temperatures of up to 400° C. can be reached provided the rotor, drive tips, and end caps are constructed of appropriate high temperature materials, such as ceramic materials.

Figure 2:
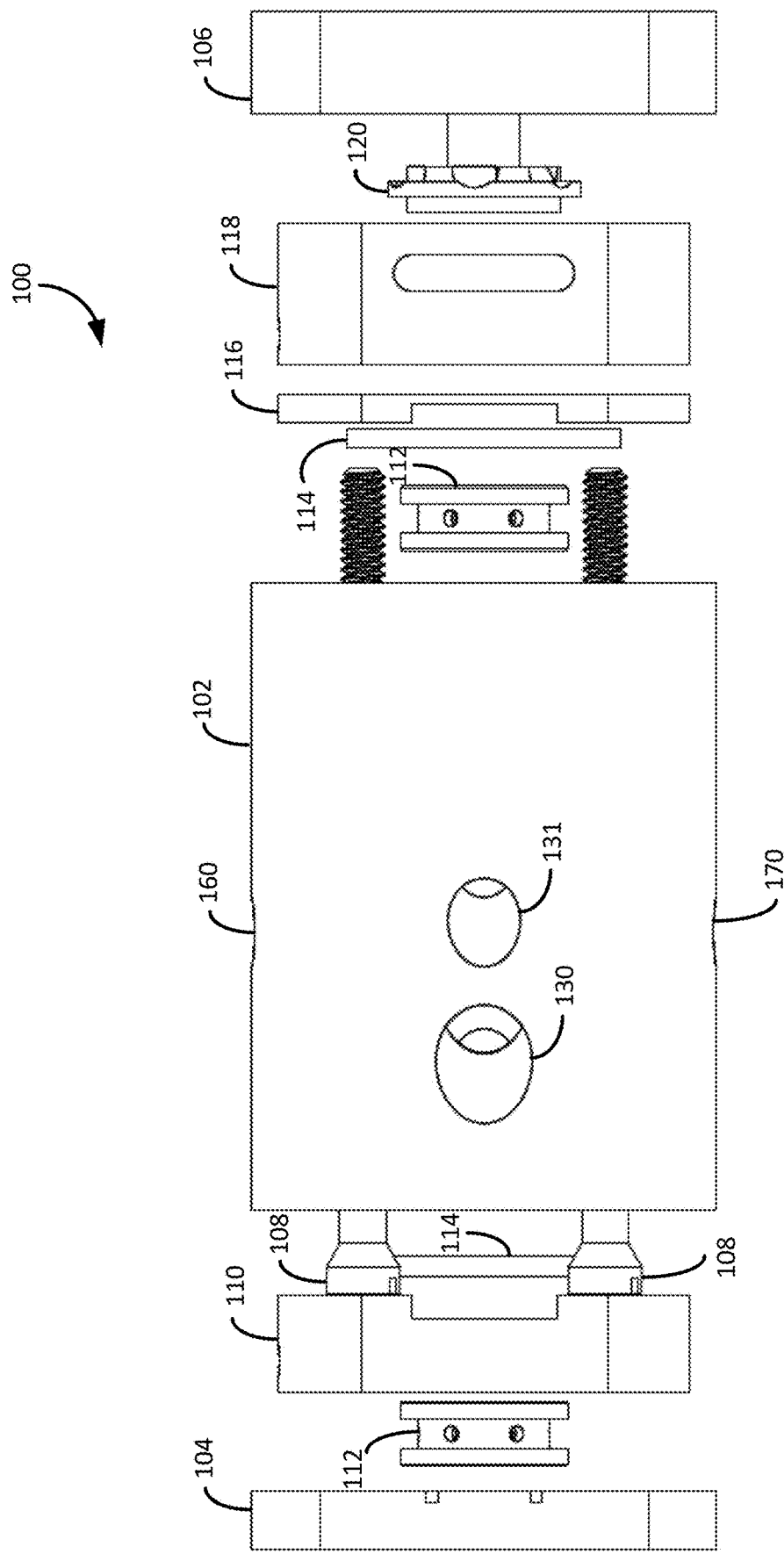
FIG. 2 is an exploded view of major components of the rotor housing assembly of FIG. 1.
Figure 3:
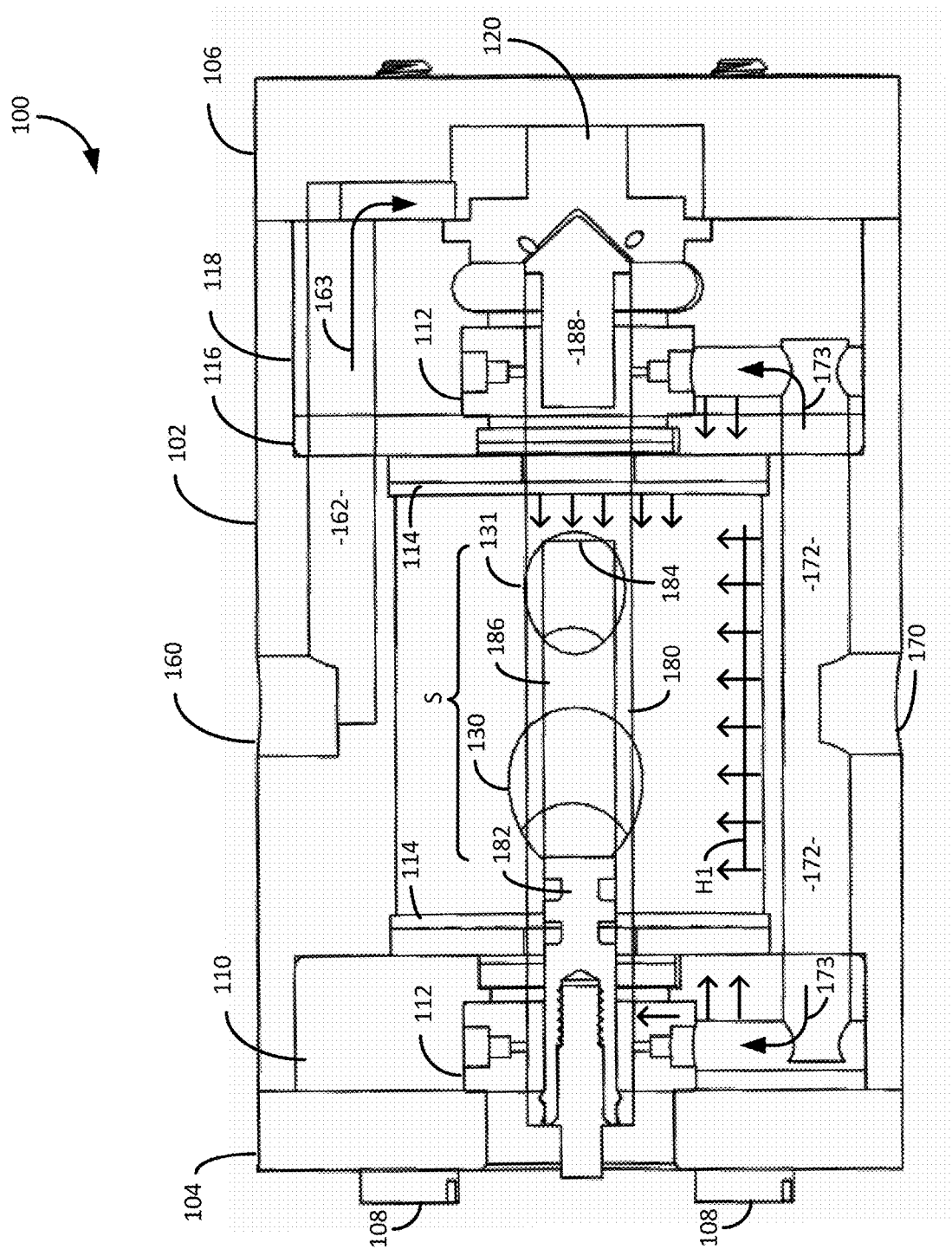
FIG. 3 is a section view in elevation of the rotor housing assembly of FIG. 1 shown with an example rotor.
Figure 4:
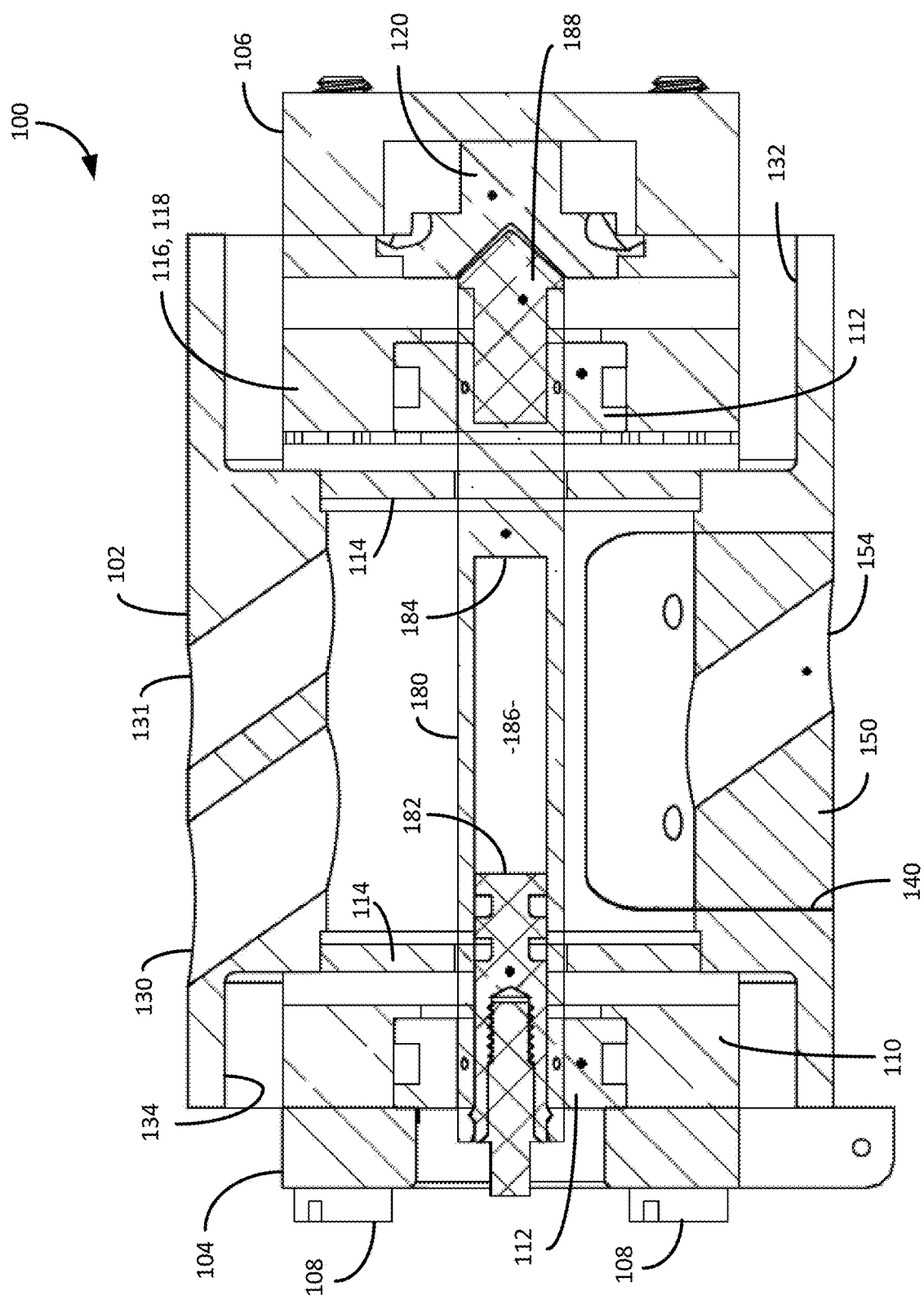
FIG. 4 is a section view in elevation of the rotor housing assembly of FIG. 3 at a different rotation.

FIG. 2 is an exploded view of the rotor assembly 100 of FIG. 1. FIG. 3 is a section view in elevation of the rotor assembly 100 as assembled and including a conventional rotor. FIG. 4 is a section view of the rotor assembly 100 in elevation at a different angle of rotation. As shown, the rotor assembly 100 has a general cylindrical hollow rotor housing 102 with a first end, also called a top end cap 104, and an opposite second end, also called a bottom end cap 106. The top end cap 104 and the bottom end cap 106 are sized to mate with end surfaces of the rotor housing 102 and are secured in place by assembly screws 108 extending axially, as is described below in more detail.

As shown in FIGS. 2-4, there is an air bearing cartridge 110 positioned within the rotor housing 102 and adjacent the top end cap 104 that houses an air bearing 112. At the opposite end, there is a drive cartridge, which may be configured as shown as a first drive cartridge part 116 and a second drive cartridge part 108, that houses a second air bearing 112. The spaces occupied by the air bearings 112 are also referred to herein as air bearing areas. At each end, there is a baffle 114 for positioning on an inner side of each of the air bearings 112, respectively. At the drive end, there is a stator 120.

In FIGS. 3 and 4, a rotor 180 is shown positioned for rotation with opposite ends supported by the air bearings 112 and a drive tip 188 received in a correspondingly recess of the stator 120. The stator 120 receives a drive air stream and directs the air against the drive 188 to drive the rotor 180 in rotation.

Figure 5:
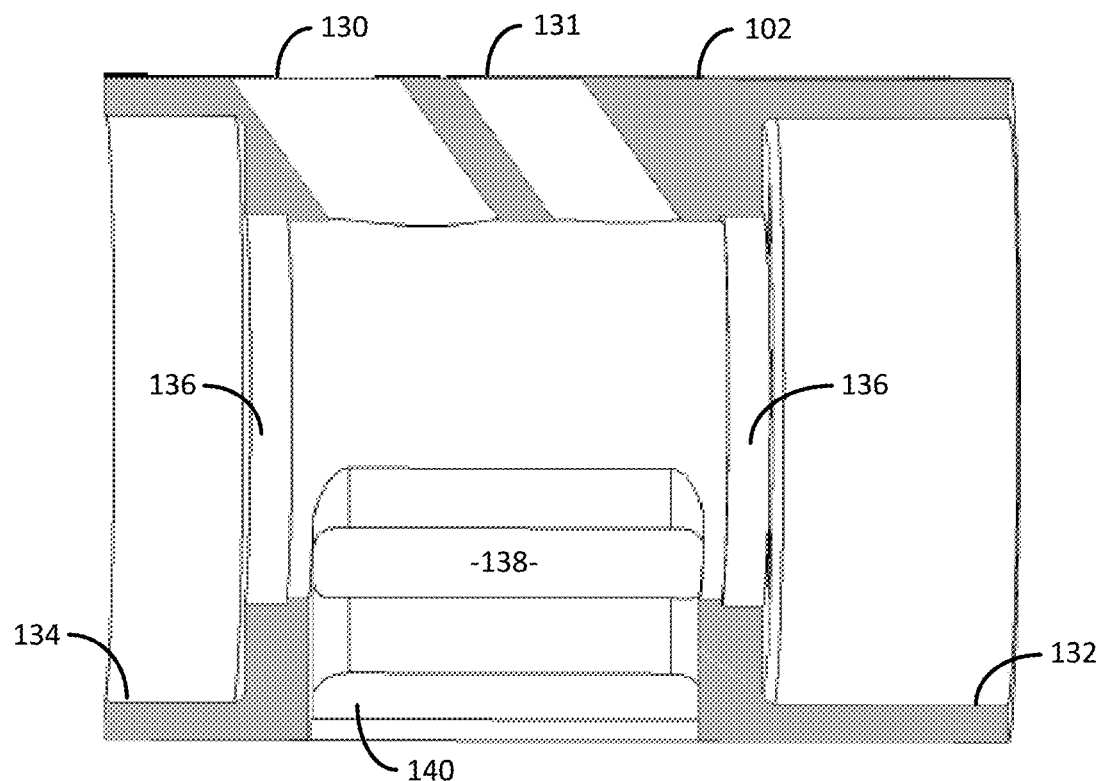
FIG. 5 is a section view in elevation of the rotor housing of the rotor assembly.

Referring again to FIG. 2, the rotor housing 102 may be provided with one or more openings to allow gas flow(s) to enter and exit the internal area around the rotor 180 and its sample space 186. In the specific example shown in FIG. 2 and described below in greater detail, the rotor housing 102 has an opening 130 and an opening 131, each extending through a side wall. In one implementation, the openings 130, 131 are exhaust openings for variable temperature (VT) air. In other implementations, one of the openings may be an exhaust opening, and the other of the openings may be an inlet opening. As best shown in FIGS. 4 and 5, the opening 130 and/or the opening 131 may be angled at an acute angle relative to the rotational axis A.

As shown in FIG. 3, in addition to the inlet and exhaust openings 130, 131, there is a drive gas inlet 160 defined in the side wall, which connects to an internal drive gas passageway 162 extending towards the drive end of the rotor housing 102. A drive gas flow 163 is shown schematically as it travels through the passageway 162 and impinges on a stator 120.

There is also a bearing gas inlet 170 defined in the side wall, which connects to an internal bearing gas passageway 172 that extends axially in opposite directions towards both the distal drive end and the proximal end. A bearing gas flow 173 is shown traveling in opposite directions of the bearing gas passageway 172 towards each of the air bearings, respectively. In the illustrated implementation, the drive gas inlet 160 and the bearing gas inlet 170 are aligned with an approximate middle portion of the sample space 186 in the rotor 180.

As shown in FIG. 4, an opening or inlet 154, which is referred to herein as the variable temperature (VT) air inlet 154, is also defined in the rotor housing 102. The VT gas inlet supplies a VT gas flow 155, which is typically heated to a high temperature, to the interior of the rotor housing 102. The VT gas inlet 154 may be configured to extend at an acute angle as shown relative to the rotational axis A. As described in more detail below, the VT gas inlet 154 can be defined in a section of the side wall of the rotor housing 102 that is removable.

Figure 6:
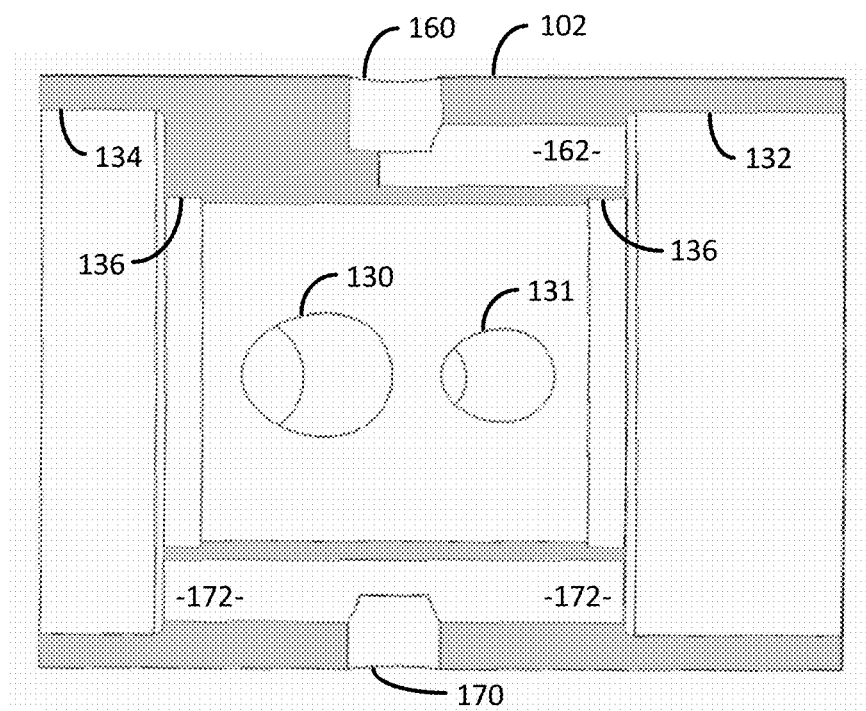
FIG. 6 is a section view in elevation of the rotor housing of FIG. 5 at a different rotation.
Figure 7:
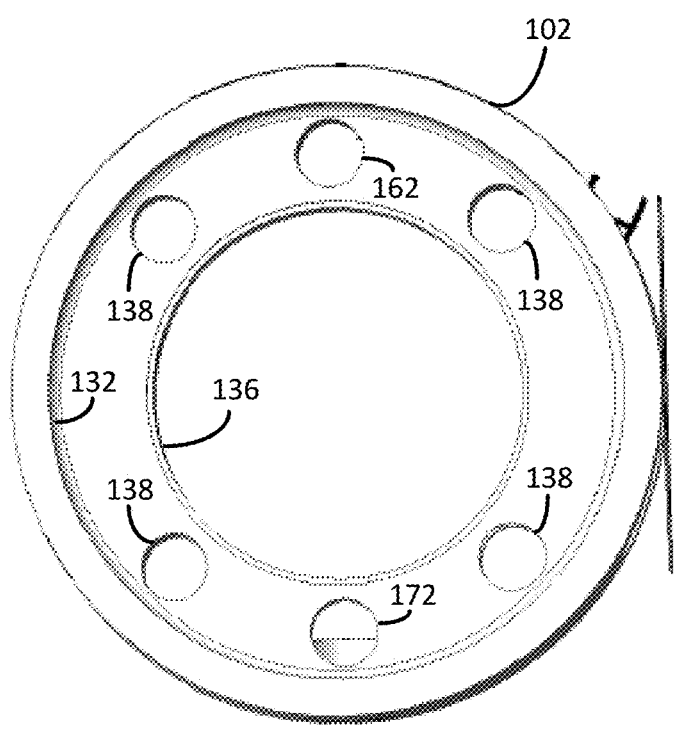
FIG. 7 is an end elevation view of the rotor housing of FIGS. 5 and 6.

FIGS. 5, 6 and 7 show the rotor housing 102 in isolation to illustrate additional details of its configuration. The rotor housing 102 has a drive end recess 132 at the drive end and a spin end recess 134 at the opposite end. A baffle recess 136 is positioned axially inward of each of the drive end recess 132 and the spin end recess 134, respectively. There are four assembly screw grooves 138 (FIG. 7) defined in the rotor housing 102 for receiving the assembly screws 108, one of which can be seen in FIG. 5. There is a coil platform opening 140 defined in a side wall of the housing 102 and shaped to receive a coil platform 150 (FIGS. 4 and 8).

FIG. 6 shows the rotor housing 102 rotated 90 degrees about the rotation axis A from its position in FIG. 5. The exhaust openings 130, 130 are seen at the inner surface of the far side wall of the rotor housing 102. The drive gas inlet 160 defined in the side wall and the portion of the drive gas passageway 162 extending within the rotor housing 102 are also shown. Similarly, also shown are the bearing gas inlet 170 defined in the side wall opposite the drive gas inlet 160 and the portion of the bearing gas passageway 172 within the rotor housing 102.

FIG. 7 shows an end elevation view of the rotor housing 102 of FIG. 6 from the distal end. As shown, the four assembly screw grooves 138 are approximately equally spaced in the circumferential direction and have circular openings where they extend through the internal body of the rotor housing 102. The drive gas passageway 162 is visible at the 12 o'clock position and the bearing gas passageway 172 is visible at the 6 o'clock position.

Figure 8:
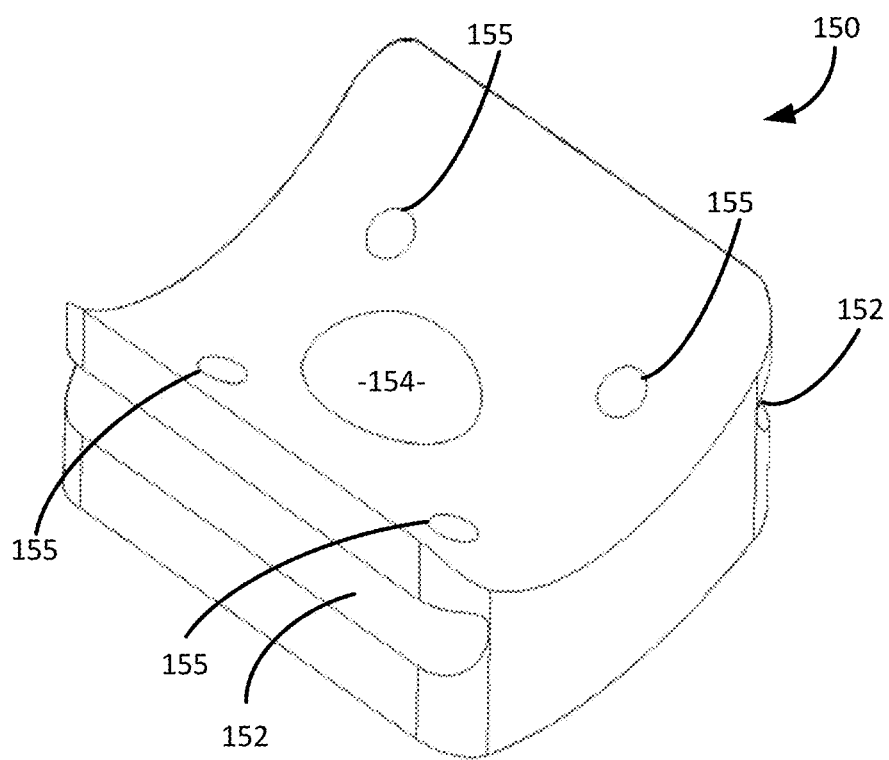
FIG. 8 is a perspective view of a coil platform that fits in the rotor housing.

FIG. 8 is a perspective view showing the coil platform 150, which is removable from the rotor housing 102, in isolation. The coil platform 150 is secured in place within the coil platform opening 140 by the presence of two of the assembly screws 108 extending along assembly screw grooves 152. As described above, the coil platform 150 includes the variable temperature air inlet 154. There are also four openings 155 for leads for an RF coil (not shown in FIGS. 1-10, but see FIG. 13) to pass through to the interior of the housing 102.

Referring again to FIGS. 3 and 4, in operation a variable temperature gas flow 155 flows into an interior of the rotor housing 102 through the variable temperature inlet 154. The variable temperature gas flow 155 is selectively controlled to have a desired temperature and flow rate. As seen in FIG. 4, the variable temperature gas flow directly impinges on the rotor 180 and tends to heat the rotor and the sample space 186 (and the received sample therein), with the most direct heating occurring in the middle portion of the rotor's length that is more directly aligned with the variable temperature inlet 154.

It has been discovered that the bearing gas flow 173, which is conventionally at an ambient temperature, can instead be selectively heated to achieve desired conditions within the sample space 186 of the rotor 180. For example, the bearing gas flow 173, which is conventionally unheated, can instead be selectively heated to increase the temperature in the interior of the rotor housing 102, e.g., at the opposite ends of the rotor 180, which are nearest the air bearings 112, 112, respectively. As indicated schematically in FIG. 4, heat transfer H1 can occur laterally along the bearing gas passageway 172 and axially through the components at the ends of the rotor housing 102, including the rotor housing 102 itself, the air bearings 112, 112, the baffles 114, 114, etc. By selectively increasing the temperature of the opposite ends of the sample space, a temperature gradient extending along the sample space from its midpoint towards either end can be reduced.

Figure 9:
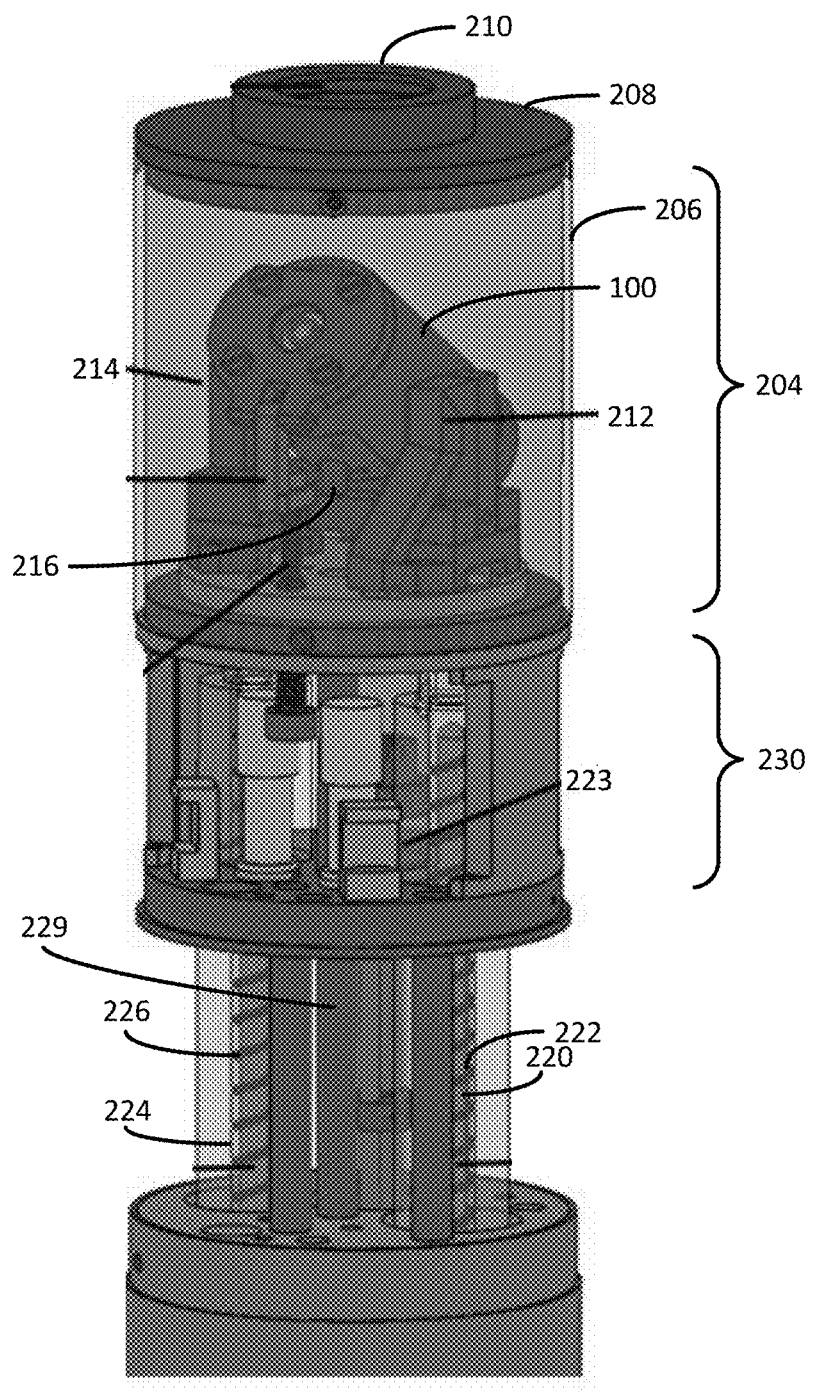
FIG. 9 is a perspective view of a distal portion of a probe assembly in which the rotor housing assembly of FIGS. 1-4 is mounted.

FIG. 9 is a perspective view of a distal end 202 of an NMR probe assembly 200 having the probe housing assembly 100 of FIGS. 1-4 mounted within a sample region 204. The sample region 204 is defined as an interior region surrounding the probe housing assembly 100 within a cylindrical shield 206 (which is illustrated as transparent in the figure) and an exhaust end cap 208. The exhaust end cap 208 has a central opening referred to as a chimney 210.

The drive gas flow 163 is supplied to the drive gas inlet 160 in the rotor housing 102 via a drive gas duct or drive gas post 212. Similarly, the bearing gas flow 173 is supplied to the bearing gas inlet 170 in the rotor housing 102 via a bearing gas duct or bearing gas post 214. The VT gas flow 155 to the VT gas inlet 154 is supplied by a VT gas duct 216, which is partially obscured in FIG. 9.

The path for the VT gas flow 155 includes a VT gas flow dewar 220. The VT gas flow dewar 220 has an internal heating coil 222 or other heating arrangement that can be controlled to produce a heated air or gas stream at a desired temperature and pressure. The bearing gas flow 173 is supplied via a bearing gas dewar 224. The bearing gas dewar 224 has an internal heating coil 226 or other heating arrangement that can be controlled to produce a heated air or gas stream at a desired temperature and pressure.

An electronics region 230 of the probe assembly 200 is positioned proximally (below, in FIG. 9) of the sample region 204. The electronics region 230 houses various electronic components of the probe assembly 200 that are used during operation. There is a purge air tube 229, which extends from a proximal end (not shown), up to and through the electronics region 230 and into the sample region 204.

Figure 10:
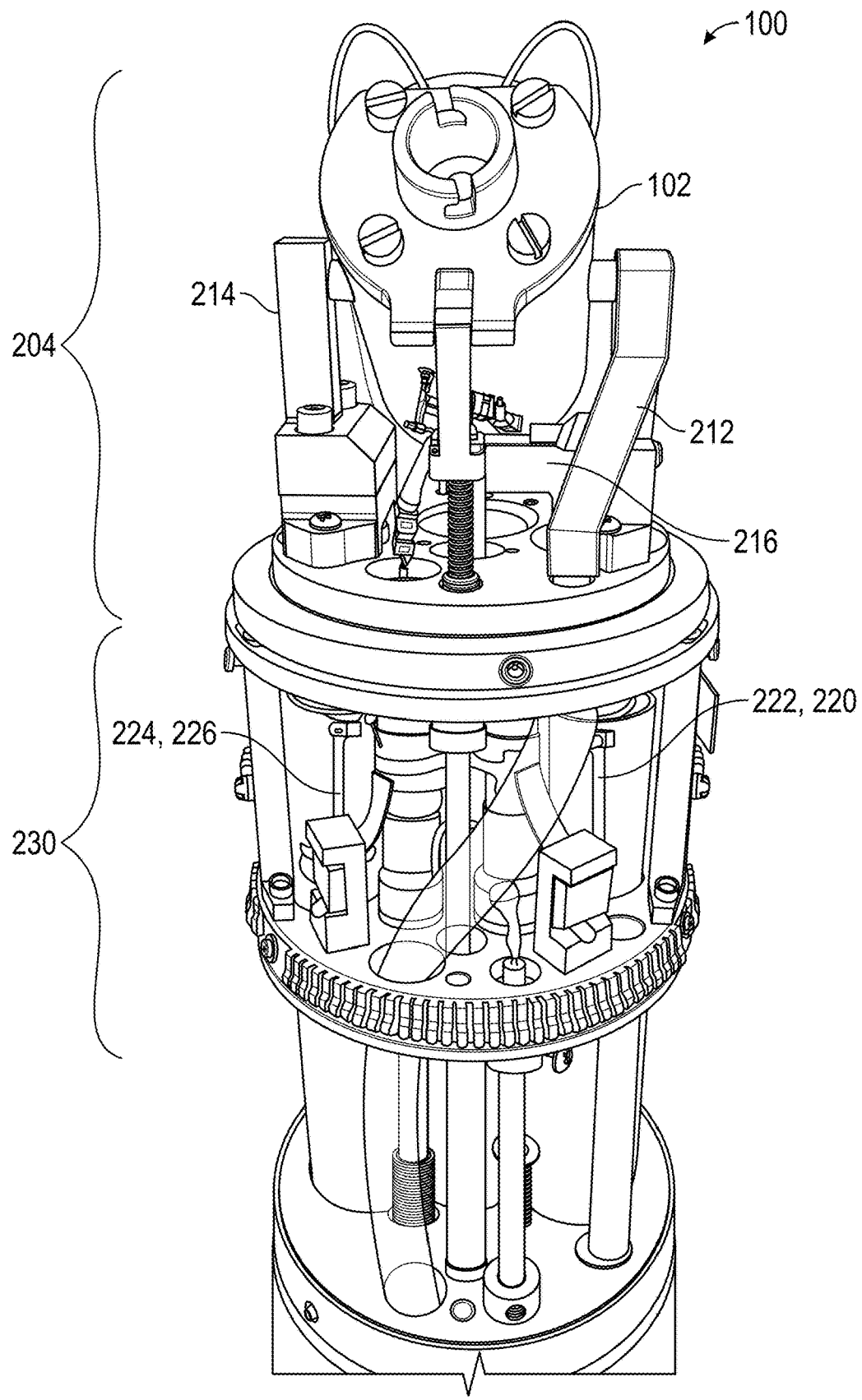
FIG. 10 is another perspective view of the probe assembly of FIG. 9 from a different angle and with a shield removed.

FIG. 10 is another perspective view of the probe assembly 200, which is similar to FIG. 9, but the probe assembly 200 has been rotated slightly and the shield 206 removed. In addition to the other gas passageways discussed above, the drive gas duct or pipe 212 is supplied via a drive gas tube 213 as best shown in FIG. 10.

Figure 11:
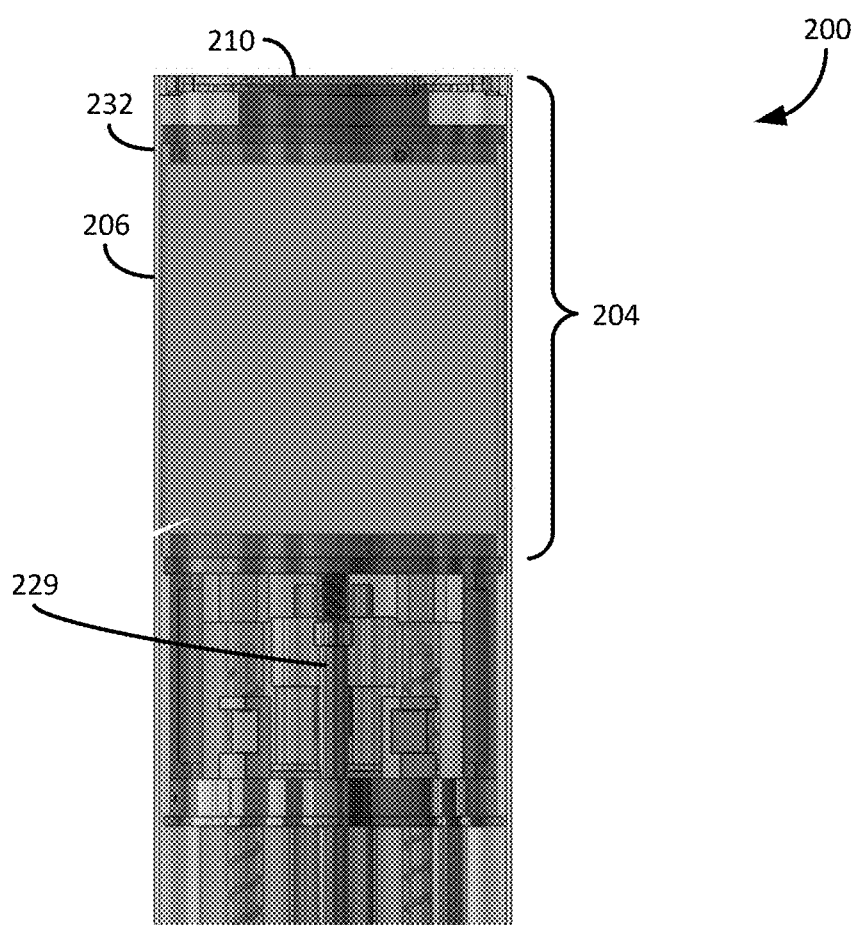
FIG. 11 is a side elevation view of the probe assembly of FIG. 9, together with an exterior shell, showing a purge operation of a sample area.

FIG. 11 is a side elevation view of the probe assembly 200 of FIG. 9, together with an exterior aluminum shell or "can" 232 installed over the shield 206. In FIG. 11, the sample region 204, shown schematically with shading, is illustrated during operation as purge air supplied via the purge air tube 229 (FIG. 9) enters the sample region 204 and mixes with the drive gas flow 163, the bearing gas flow 173 and/or the VT gas flow 155 that have been exhausted from the probe housing assembly 100 and are at elevated temperatures, causing the combined air volume to be exhausted through the chimney 210.

Figure 12:
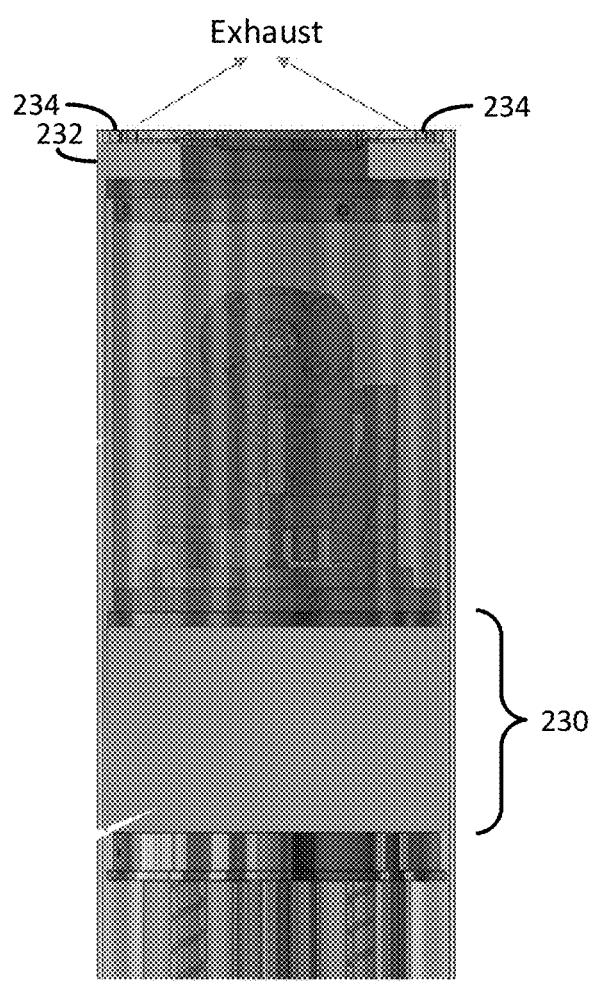
FIG. 12 is a side elevation view similar to FIG. 11, except showing a purge operation of an electronics area.

FIG. 12 is another side elevation view of the probe assembly 200 similar to FIG. 11, but showing the electronics region 230 being purged during operation by a flow of purge air from a purge air tube 223 (FIG. 9, shown transparent in the drawing) that enters the electronics region 230 from below and forces air in the electronics region 230 to be exhausted via the annular space between the shield 206 and the can 232 and openings 234 in the end.

Figure 13:
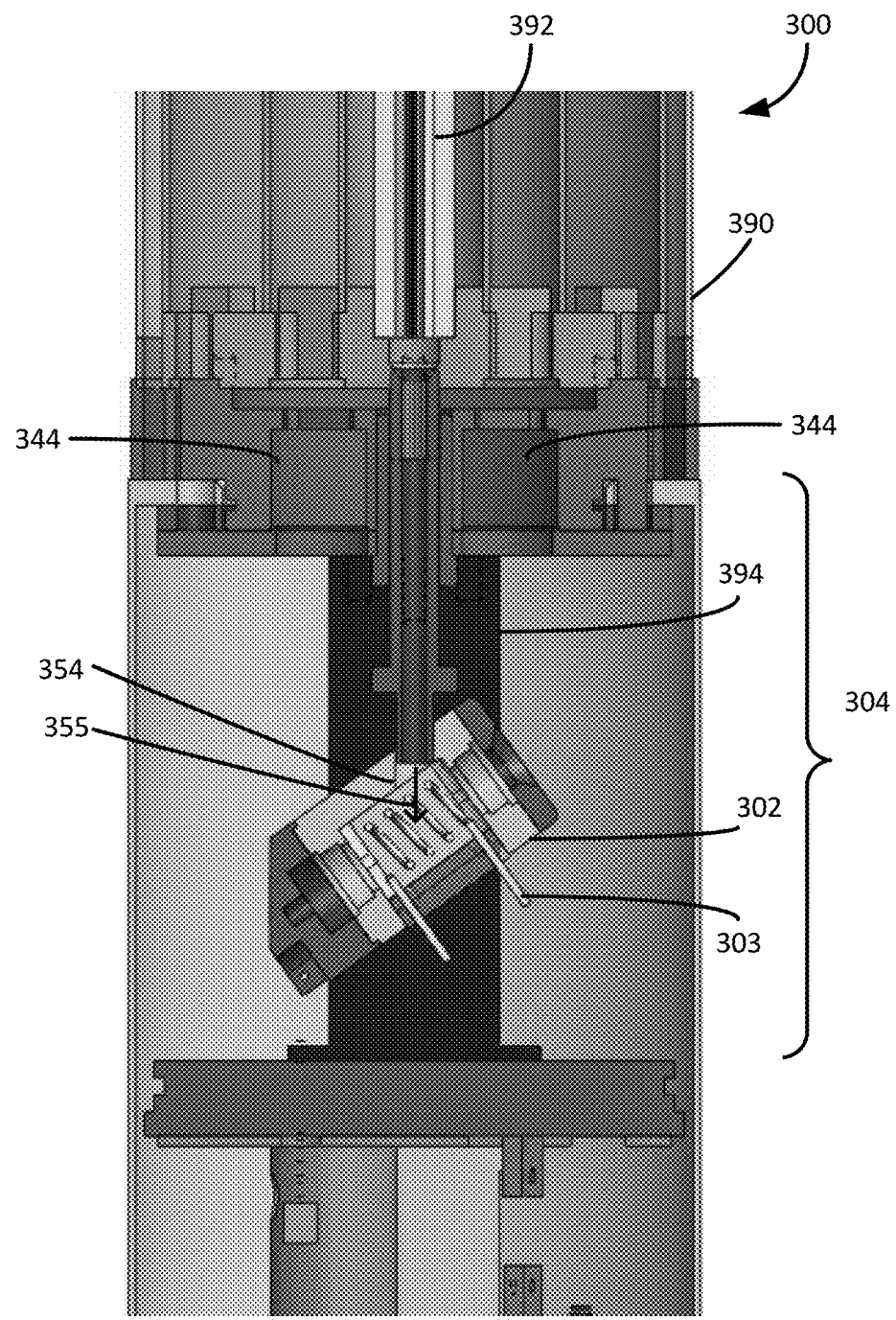
FIGS. 13 and 14 side elevation views of another embodiment of the probe assembly having multiple heated air flows.
Figure 14:
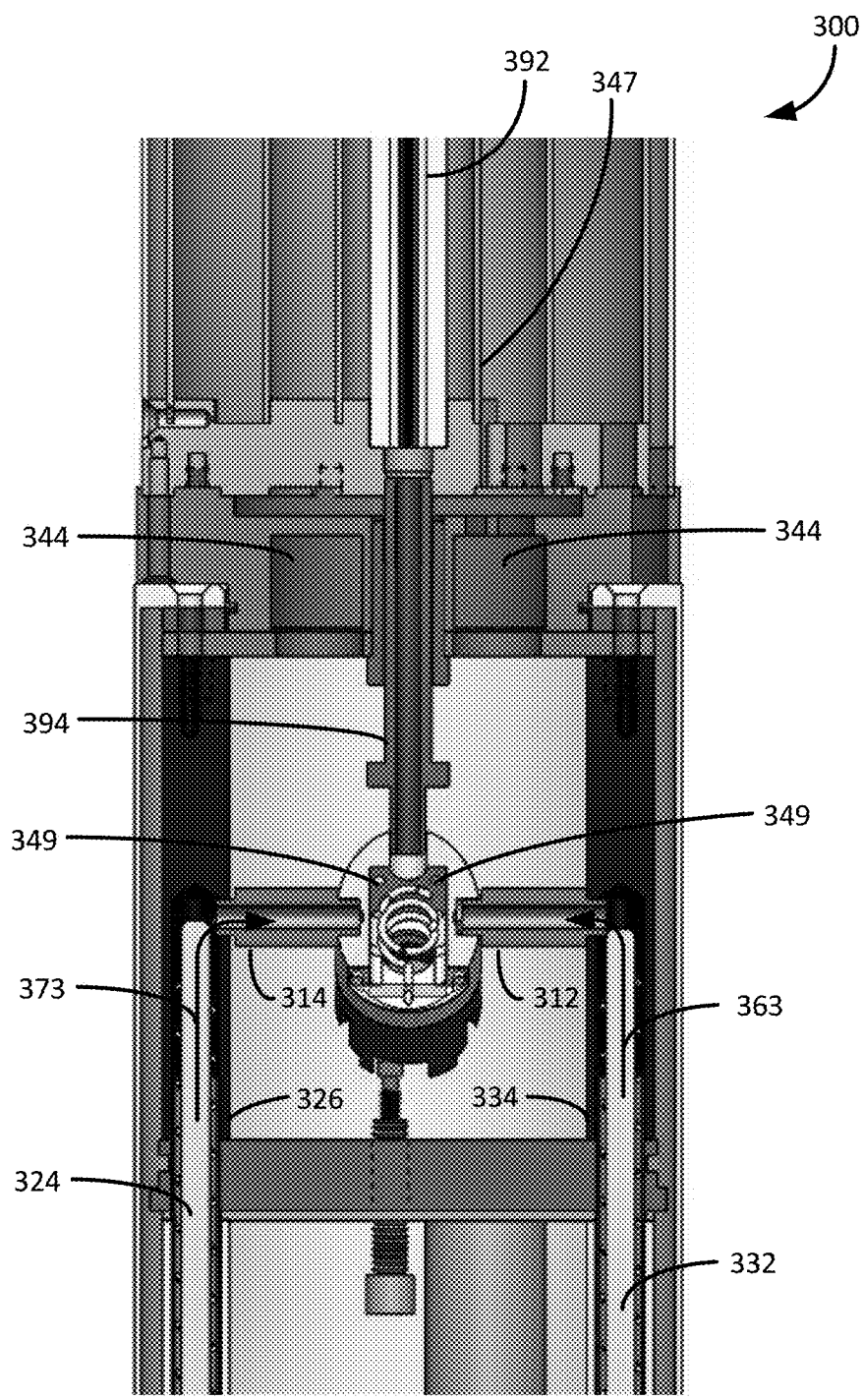

FIGS. 13 and 14 are sectioned side elevation views of a probe assembly 300 having multiple heated gas flows according to another implementation. In the probe assembly 300, there is a VT stack 390 (shown partially) mounted distally of the sample region 304 (i.e., above the sample region 304, in the depiction of FIGS. 13 and 14). Within the VT stack 390, there is a VT gas supply with sections 392 and 394 that connects to the VT gas inlet 354 in the rotor housing 302 to supply the VT gas flow 355. The VT gas inlet 354 is rotated about 180 degrees from its position in FIGS. 1-4. As also shown in FIG. 13, the rotor housing 302 is shown fitted with an RF coil 303 used for NMR (for clarity of illustration, the rotor, air bearings and other internal components are not shown). As shown in FIG. 13, there are purge openings 344 that allow hot gases to be purged away from the sample section 304 and into the VT stack 390, to be exhausted outside of the probe assembly 300 via an exhaust tube 347.

As best shown in FIG. 14, there is a bearing gas flow post (or duct) 314 that conveys the bearing gas flow 373 to the rotor housing 302. The bearing gas flow post 314 is connected to a bearing gas flow dewar 324 that has a heating element 326. At the opposite side of FIG. 14, there is a drive gas post 312 (or duct) that conveys the drive gas flow 363 to the rotor housing 302. The drive gas post 312 is connected to a drive gas dewar 332.

Figure 16:
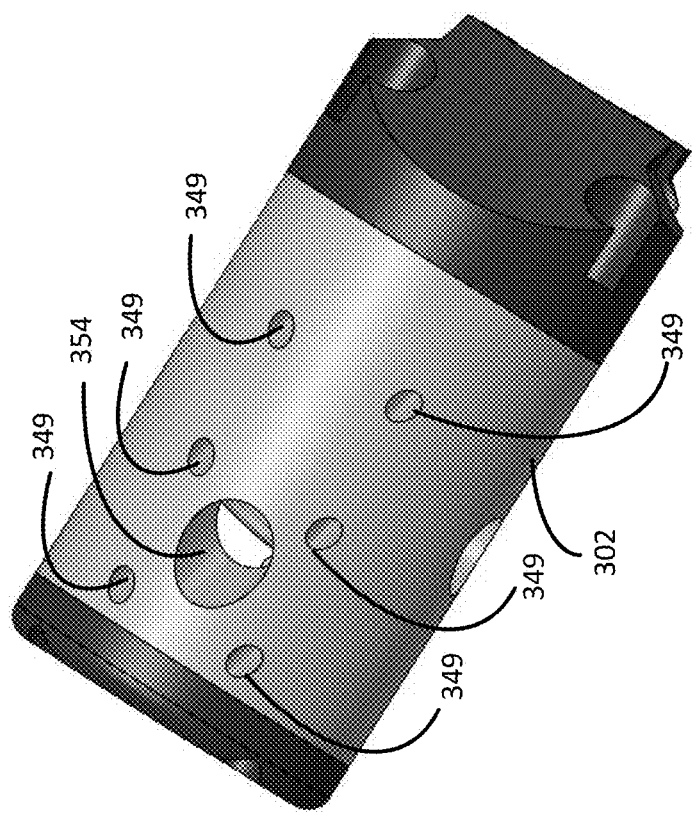
FIG. 16 is a perspective view of the rotor housing of FIGS. 13-15 shown in isolation.

As shown in FIG. 14 and FIG. 16, which shows the rotor housing 302 in isolation, there are VT gas exhaust openings 349 in the rotor housing 302 to allow VT gas to be vented from the interior of the rotor housing. Because the exhaust openings 349 are spaced apart and include locations near the proximal and distal ends of the housing 302, the VT gas flow will circulate throughout the interior space and around the rotor more fully, which is expected to lead to more uniform heating of the sample space.

In the probe assembly 300, the drive gas flow 363 (or other drive gas flow) is heated, such as with a coil 334 or other heating arrangement, similar to the bearing gas flow 373. Thus, in the probe assembly 300, there are three heated gas flows: the VT gas flow 355, the bearing gas flow 373 and the drive gas flow 363.

Figure 15:
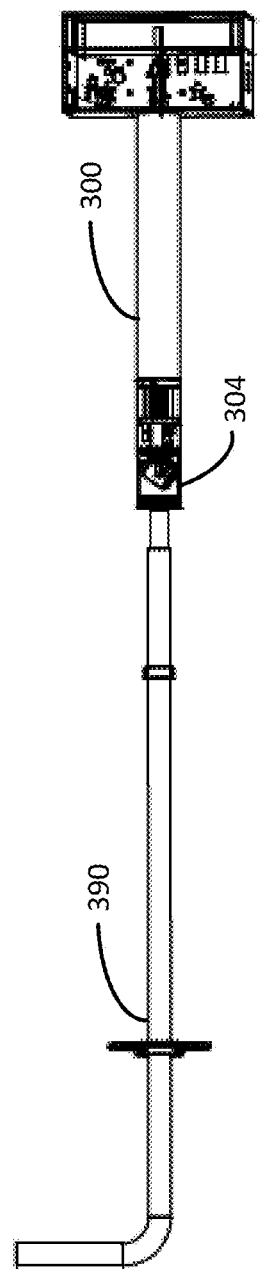
FIG. 15 is a side elevation view of the probe assembly of FIGS. 13 and 14 with an elongated stack attached.

FIG. 15 is a side elevation view showing the full length of the probe assembly 300 with the VT stack 390 attached. The VT stack 390 thus extends distally from the sample region 304 and out of the magnet area (not shown) so that hot gases are exhausted away from the magnet.

Example 1

MAS NMR experiments were performed on a 600 MHz Bruker Avance III spectrometer using 5 mm zirconia rotors spinning at 5000±10 Hz. A series of experiments were conducted by increasing VT stepwise from 20° C. to 350° C. and varying bearing flow (BT) heating in the range from 20° C. to 180° C. with an interval of ~20° C. Boron nitride spacers were used instead of Teflon spacers. The gas flow rates were set to 40 LPM for VT, 60 LPM for sample region purge and 70 LPM for electronics region purge to maintain shim temperatures below 60° C. when the sample temperature was maintained at 350° C. for 8 hours. The average drive pressure and bearing pressure for 5 mm rotors spinning at 5 kHz were 10 psi and 16 psi, respectively. The sample was equilibrated at each temperature for at least 10 minutes before NMR measurements. The $^{207}$Pb spectra were obtained with 8 scans at VT<200° C., 32 scans at 200° C.≤VT≤250° C., and 128 scans at VT>250° C., using a 90° pulse width of 5 μs (corresponding to an excitation bandwidth of 50 kHz) at 200 W and a recycle delay of 10 s.

The chemical shift of $^{207}$Pb in solid lead nitrate Pb(NO$_3$)$_2$ is sensitive to temperature variations and is commonly utilized as a temperature calibration standard up to 400° C. in MAS NMR. In this experiment, $^{207}$Pb direct polarization of Pb(NO$_3$)$_2$ was used to characterize the effect of bearing flow heating on the temperature gradient across the sample space of the rotor with its entire length (12 mm) filled with sample.

The chemical shift of $^{207}$Pb in lead nitrate was set to 0 ppm at 20.1° C. The actual sample temperature T (° C.) is related to $^{207}$Pb chemical shift δ (ppm) using equation (1):

$$T = \delta/0.725 + 20.1 \quad (1)$$

Figures 17A, 17B:
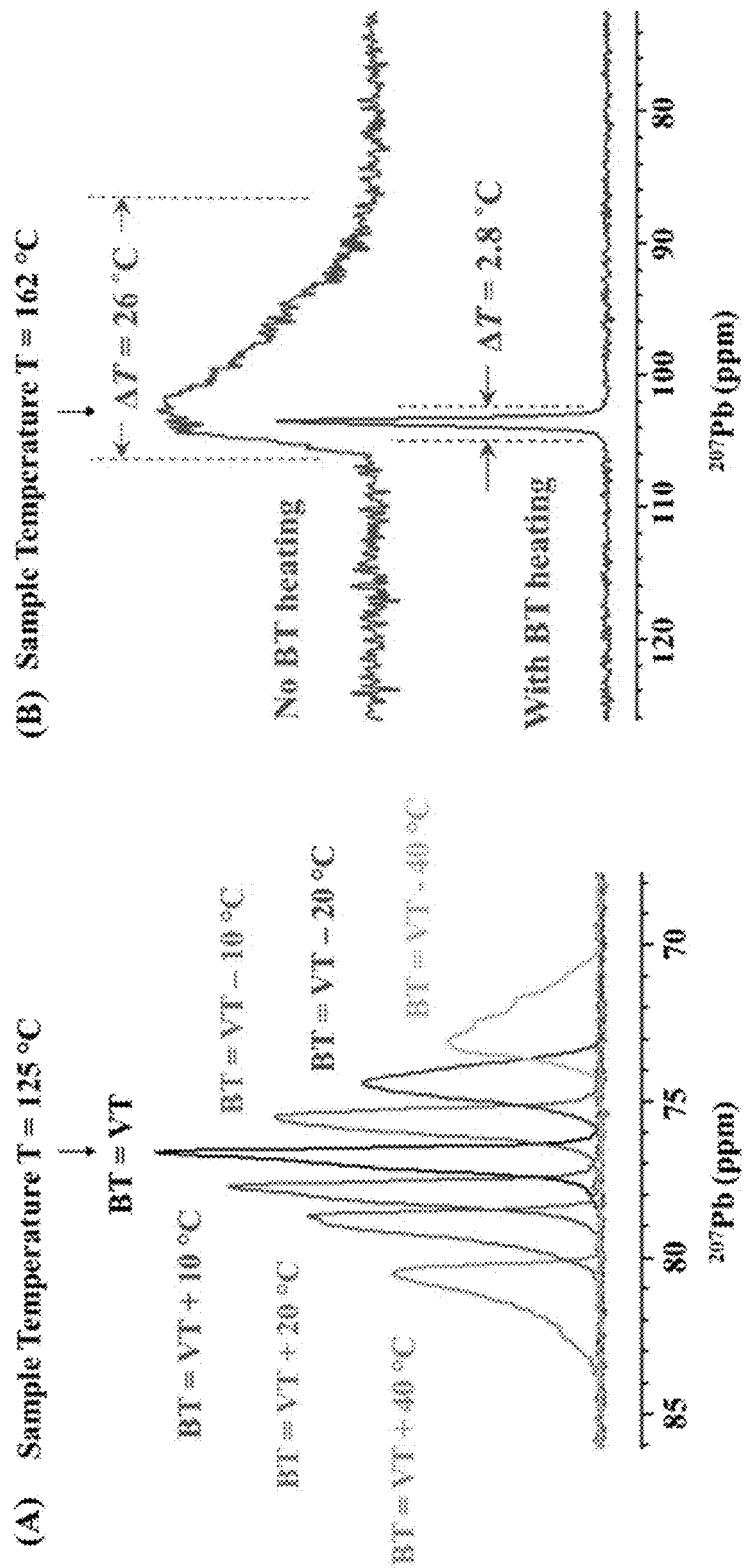
FIG. 17A is a graph showing $^{207}$Pb spectra as achieved with varying bearing gas flow (BT) temperatures compared to the variable temperature (VT) gas flow.
FIG. 17B is a graph showing a more defined sharp peak for $^{207}$Pb spectra with heated bearing gas flow and a less defined broad peak with no heated bearing gas flow.

As shown in FIG. 17A, the linewidth and shape of the $^{207}$Pb spectrum are determined by the difference between BT and VT. When BT equals VT, a symmetric Lorentzian peak is obtained with the smallest linewidth, while a shoulder at lower (or higher) frequency is produced when BT is smaller (or greater) than VT. The temperature gradient across the sample, ΔT, is calculated from the linewidth at 5% peak height using ΔT=Δδ/0.725. As is shown in FIG. 17B, at a sample temperature of T=162° C., the temperature gradient ΔT is reduced dramatically from 26° C. without bearing flow heating to 2.8° C. with bearing flow heating, where BT=VT (FIG. 3B).

Figure 18:
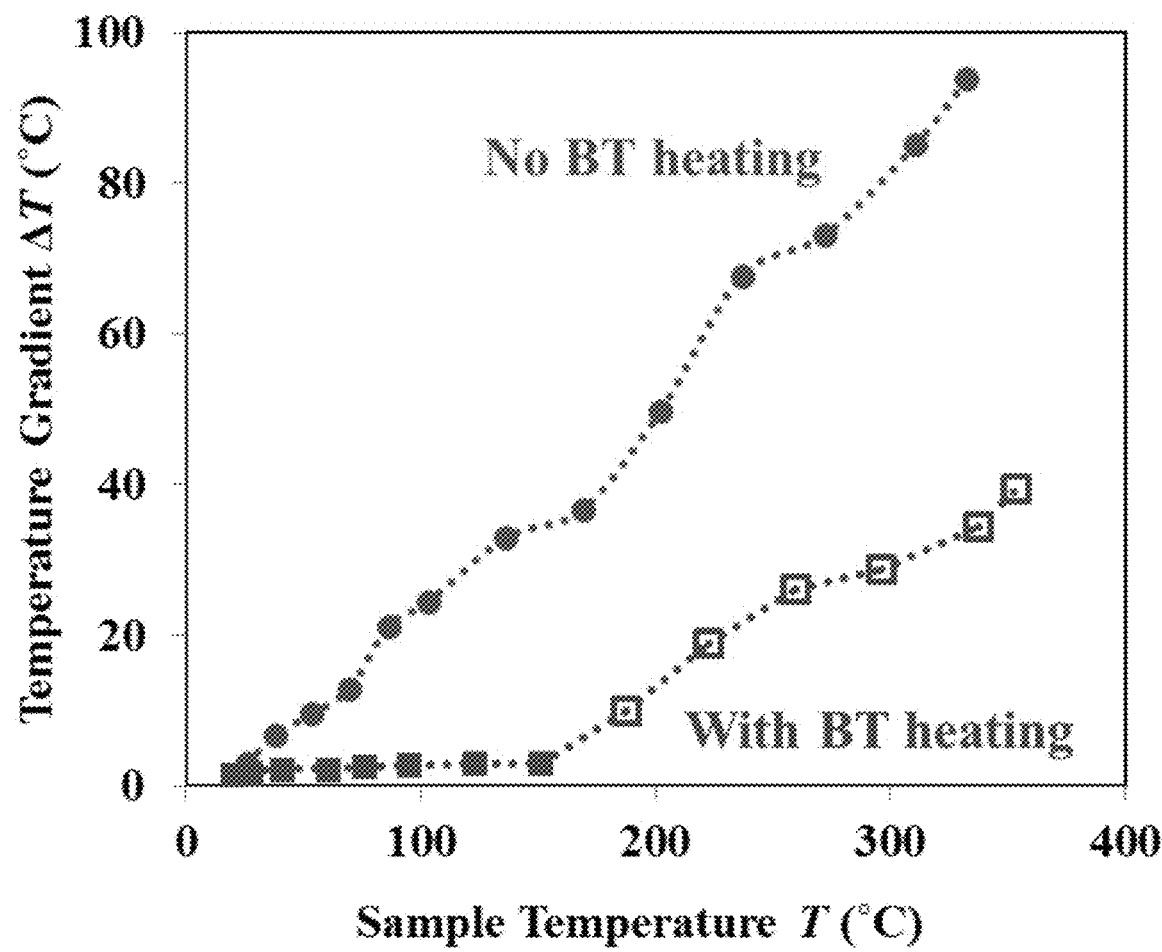
FIG. 18 is a graph of temperature gradient within the sample with and without bearing gas flow heating.

FIG. 18 is a graph showing the temperature gradient, ΔT, plotted against the sample temperature T with bearing flow heating (squares) and without bearing flow heating (filled circles). As can be seen, a temperature gradient of less than 4° C. is achieved with BT=VT when VT≤180° C. (filled squares). Due to the upper limit of BT at 180° C., ΔT increases with T when VT>180° C. (hollow squares), but is still 2-3 times lower than with no bearing flow heating. For example, ΔT=39° C. at T=350° C. with BT=180° C., while ΔT=94° C. at T=333° C. with BT=20° C.

Figures 19A, 19B:
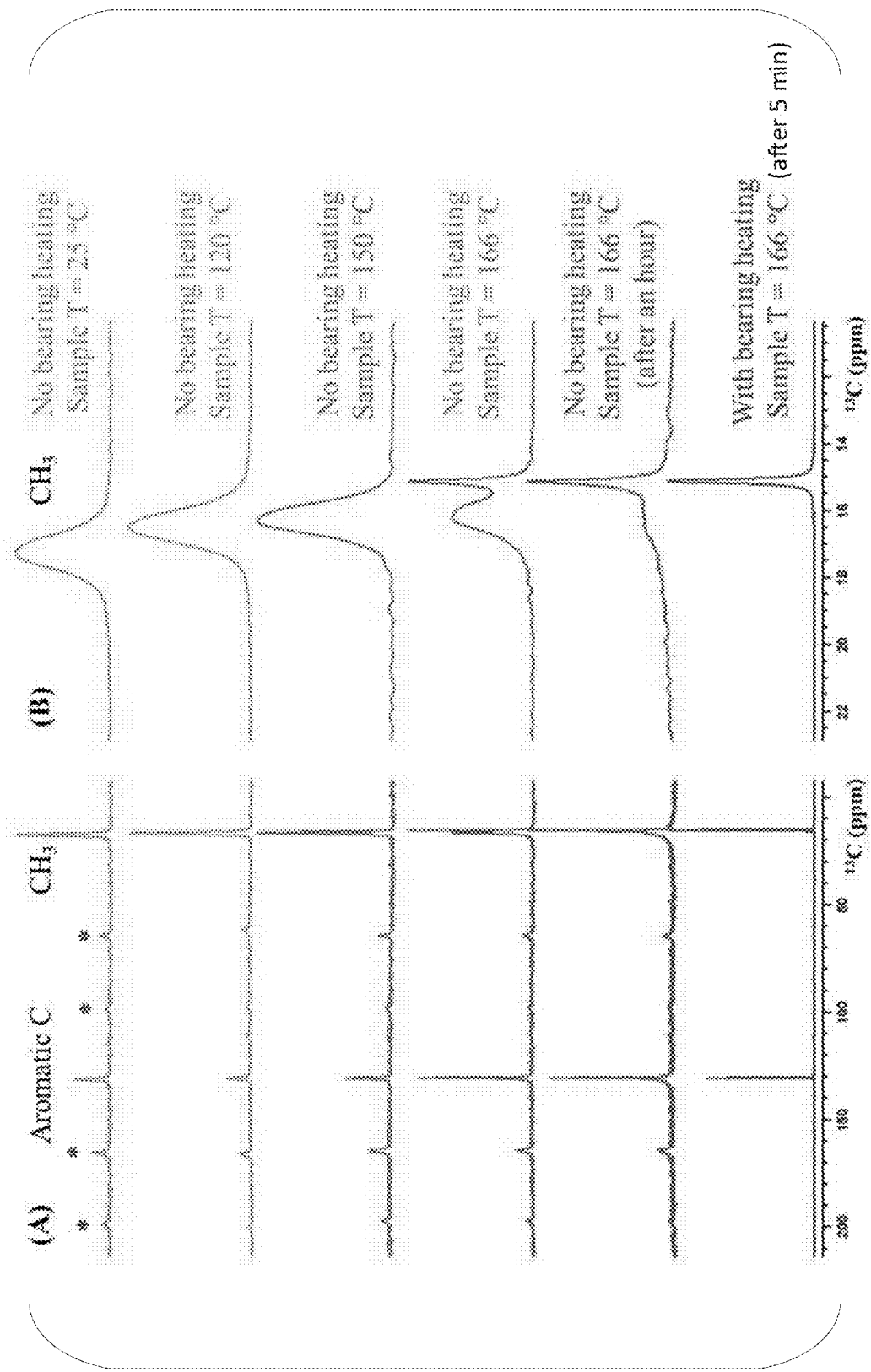
FIGS. 19A and 19B are graphs of $^{13}$C MAS spectra of hexmethyylbenzene (HMB) at temperatures from 25° C. to 166° C. without bearing gas flow heating and with bearing gas flow heating, showing a broad range (FIG. 19A) and a magnified view of a narrower range (FIG. 19B).

To further demonstrate the effect of temperature gradient in solid-state NMR spectra, FIGS. 19A and 19B show $^{13}$C MAS spectra of hexamethylbenzene (HMB) at temperatures ranging from 25° C. to 166° C. at a spinning speed of 5 kHz. In FIG. 19A, spinning sidebands are denoted with an *. As shown in FIG. 19B, solid HMB (the downfield broader peak) and liquid HMB (the upfield sharper peak) coexist for more than an hour at the melting temperature with no bearing flow heating. With no bearing flow heating, the temperature gradient is approximately 26° C. at the melting point. With bearing flow heating, however, the whole HMB sample has converted to the liquid phase in 5 minutes due to a small temperature gradient of ~3° C. As can be seen by the sharp peak obtained with bearing flow heating, the signal to noise ratio is superior to the results obtained without bearing flow heating.

To investigate in-situ chemical reactions that happen within a certain temperature range, a uniform temperature distribution across the rotor (sample space) is especially important, thus establishing that the implementations of the probe design described herein are particularly suited for these measurements.

Example 2

Compared to conventional systems (including the Doty HT probe or the Bruker LASERMAS system), another advantage of the present design is its compatibility with pressurized MAS rotors that can hold pressures up to 400 bar, such as the WHiMS rotors, which are available from Revolution NMR LLC. The combination of the high-temperature and high-pressure capacities allows for a great variety of in-situ solid-state MAS NMR investigations of materials and chemical reactions that are inaccessible to NMR studies in the absence of these hardware and component improvements. As one illustration, in-situ NMR monitoring of the industrial synthesis of CH$_3$OH from a mixture of CO$_2$ and H$_2$ based on a Cu/ZnO/Al$_2$O$_3$ heterogeneous catalyst was completed. FIGS. 20A and 20B show the $^{13}$C and $^1$H MAS spectra of the reaction kinetics at 325° C. under a pressure of 60 bar 1:2 CO$_2$:H$_2$, with the concentration of CH$_3$OH and H$_2$O quickly increasing and reaching equilibrium within 30 minutes while the concentration of CO decreases with time. As indicated, the spectra were collected every six minutes from zero to 30 minutes.

CH$_3$OH formation at 325° C. occurs via CO and CO$_2$ hydrogenation routes in the absence of the organic solvents (Eq. 2 and 3):

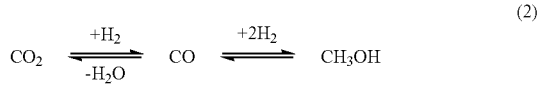

(2)

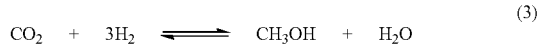

(3)

In previous studies using pressurized rotors, experiments were carried out at lower temperatures of 120-170° C. (where a significant amount of alkyl carbonate, ammonium formate and alkyl ester were involved in the reaction as the key intermediates in the presence of tertiary amines and alcohols). In contrast, this experiment, which was carried out at 325° C., achieved the first demonstration of NMR spectra at temperatures higher than 250° C. using pressurized rotors.

Example 3

In this example, a series of simulations were conducted using Solidworks Flow Simulation 2012, which is a computational fluid dynamics solver integrated within Solidworks for flow and heat transfer applications. Simulations included modelling of the rotor housing made of Celazole as well as a MAS rotor made of Zirconia. The drive and bearing inlets were assigned boundary conditions of 10 psi and 15 psi, respectively, which correspond to a spinning speed of 5 kHz. The VT boundary was set up for a 40 liter per minute (LPM) of nitrogen inlet. The generated mesh included 376501 cells and the calculation converged in 326 iterations. For the first simulation, the VT gas flow temperature was set to 180° C. with bearing and drive gas flows set at 25° C. In the second simulation, both the VT and bearing gas flow temperatures are set to 180° C., while the drive gas flow is at 25° C. Comparing FIG. 21B to FIG. 21A shows that the temperature gradient is significantly reduced when the bearing gas flow temperature is heated to the same temperature as the VT gas flow temperature.

Example 4

A suitable exemplary probe was designed for use with a 14.1 T wide-bore Bruker Avance III spectrometer, but can be used with most 70 mm bore shim sets with an appropriate mounting collar. The rotor housing is a 5 mm Varian Pencil 2 design obtained from Revolution NMR that is crafted from high temperature plastic (Celazole PBI). Celazole PBI is a thermoplastic material rated for continuous operation at temperatures up to 420° C. when used with nitrogen gas. Two Inconel heater assemblies with nonmagnetic Type E thermocouples from ARI Heaters are housed inside triple walled Quartz dewars obtained from Wilmad Labglass for heating the VT and bearing gas flows. The dewars are silver plated, which reduces probe body heating caused by radiated heat. The thermocouples are welded to the heater assemblies, which have helical heat exchangers made of Inconel welded to the heaters to increase surface area for better heat transfer. The dewars are connected to the rotor housing using Celazole PBI parts. Springs are used to hold the heaters in place, and also allow for expansion and contraction as parts thermally cycle. The housing region is enclosed with a shield which directs all of the heated gas, as well the drive and sample region purge gas streams, to the top of the probe (distal end) to be exhausted into a thermally insulated line that vents outside the magnet. The shield is a 3D printed part obtained from Cideas Inc., which offers printed parts for applications up to 290° C. The electronics region purge follows around the shield and prevents the probe body from overheating the shims.

In implementations in which the drive gas flow is at room temperature and is not heated, standard Zirconia and Silicon Nitrite rotors with Vespel drive tips can be used. While the VT gas stream is heated to 350° C., the bearing flow heating is limited to 200° C. to maintain a temperature well below the softening point temperature of end caps and drive tips made of typical materials (Vespel or KeIF).

In some implementations, a custom designed temperature controller, which has two Omega CN8201 controllers, an NI USB-6009 ADC and a NI USB-9211A thermocouple reader, is used. The temperatures of the VT and bearing flows are controlled, while monitoring the sample and electronics region temperature via custom Labview software. Optionally, the drive flow temperature can also be controlled. The temperature controllers are configured to provide a pulsed DC output for use with a solid-state relay which regulates the 48 VDC power supply to drive the heaters. Filter capacitors in front of the heaters and thermocouples improve the noise immunity of the probe.

The probe is a double resonance HX probe with a circuit where the proton side tuning is accomplished with an adjustable quarter wave resonator and the low frequency side is tuned via capacitors which have plug in attachments to cover different frequency ranges. The sample coil is a 5-turn solenoid which is 15 mm long and has a 6 mm inner diameter. The coil wire is a gold flashed magnetic susceptibility matched wire designed for use at temperatures up to 500° C., purchased from Doty Scientific Inc. The probe can also be enabled for in situ constant flow experiments at high temperatures. See U.S. Pat. No. 9,194,920 B2, which is incorporated herein by reference.

In the descriptions herein, the drive gas can be air, or, as is more suitable at higher temperatures, nitrogen.

In the descriptions of various implementations herein, the second heated gas flow, in addition to the VT gas flow (first heated gas flow), is routed to heat areas of the sample space that are coolest relative to where the VT gas flow in conveyed against the rotor. Thus, it is proximal and distal areas, or ends of the sample space, that are described as receiving the second heated gas flow. But the effects of heating the sample space at intermediate points away from where the VT gas flow is primarily directed still help reduce the temperature gradient.

Thus, as described herein, new probe and probe component designs have been presented that improve the temperature gradient across the sample during VT experiments by heating the bearing gas flow (and, optionally, the drive gas flow), in addition to heating the VT gas flow. Simulation results showed diminished temperature gradients while using standard rotors, end caps and drive tips. Lead nitrate experiments at a maximum sample temperature of 350° C. show that the temperature gradient across the sample is significantly reduced compared to conventional heating. In some specific examples, the temperature gradient was maintained below 3° C. when the sample temperature was under 180° C. The reduced temperature gradient is especially important for monitoring in-situ phase transitions, as was shown for the $^{13}$C NMR spectra of HMB at 166° C. Also, the reaction kinetics of industrial $CH_3OH$ synthesis using $^{13}$C and $^1$H MAS NMR spectra were monitored for a mixture of $CO_2$ and $H_2$ with a $Cu/ZnO/Al_2O_3$ catalyst, demonstrating the first NMR spectra at temperatures higher than 250° C. using pressurized rotors. The combination of this high-temperature probe and the high-pressure rotors, which can now be operated with reduced temperature gradients even up to temperatures of 400° C., will allow in-situ NMR studies of a great variety of chemical reactions previously out of reach for conventional NMR systems.

For purposes of this description, certain aspects, advantages, and novel features of the implementations of this disclosure are described herein. The disclosed methods, apparatus, and systems should not be construed as being limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

As used in this disclosure and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In some examples, values, procedures, or apparatus may be referred to as "lowest," "best," "minimum," or the like. It will be appreciated that such descriptions are intended to indicate that a selection among many alternatives can be made, and such selections need not be better, smaller, or otherwise preferable to other selections.

In the description, certain terms may be used such as "up," "down," "upper," "lower," "horizontal," "vertical," "left," "right," and the like. These terms are used, where applicable, to provide some clarity of description when dealing with relative relationships. But these terms are not intended to imply absolute relationships, positions, and/or orientations. For example, with respect to an object, an "upper" surface can become a "lower" surface simply by turning the object over. Nevertheless, it is still the same object.

Unless otherwise indicated, all numbers expressing quantities of components, forces, moments, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under test conditions/methods familiar to those of ordinary skill in the art. When directly and explicitly distinguishing embodiments from discussed prior art, the embodiment numbers are not approximates unless the word "about" is recited. Furthermore, not all alternatives recited herein are equivalents.

Although various preferred embodiments of the disclosure are shown and described, it is to be distinctly understood that this disclosure is not limited thereto but may be variously embodied to practice within the scope of the following claims. From the foregoing description, it will be apparent that various changes may be made without departing from the spirit and scope of the disclosure as defined by the following claims.

The invention claimed is:

1. A rotor housing assembly for holding and spinning a sample during NMR spectroscopy, comprising:
   an elongate rotor having a distal drive end, a proximal end and an internal sample space positioned along a rotor length between the drive end and the proximal end, the rotor being driveable to rotate about a rotation axis by a drive gas flow;
   a housing having an interior space in which at least a portion of the rotor is received;
   at least one first heated gas flow inlet positioned in the housing and opposite the internal sample space of the rotor, wherein a first heated gas flow from a first gas source is controllably flowable through the first heated gas flow inlet and into the interior space of the housing to heat the interior space and the rotor; and
   at least a pair of spaced apart second heated gas flow outlets that are axially spaced from the first heated gas flow inlet and positioned towards the distal drive and proximal ends of the rotor, respectively, wherein a second heated gas flow from a second gas source through the second heated gas flow outlets is controllable to heat distal and proximal areas of the sample space within the rotor to minimize a temperature gradient extending axially within the sample space.

2. The rotor housing assembly of claim 1, further comprising proximal and distal air bearing areas in the housing positioned to receive air bearings for rotatably supporting the rotor, and wherein the second heated gas flow outlets are configured to direct the second heated gas flow towards the proximal and distal air bearing areas, respectively, wherein the second heated gas flow comprises a heated bearing gas flow.

3. The rotor housing assembly of claim 1, wherein the first heated gas flow comprises a heated variable temperature (VT) gas flow.

4. The rotor housing assembly of claim 1, further comprising a drive gas inlet positioned adjacent the drive end of the rotor, wherein the drive gas flow is controllable to flow through the drive gas inlet to impinge on the drive end and drive the rotor to rotate.

5. The rotor housing assembly of claim 4, wherein the drive gas flow is unheated.

6. The rotor housing assembly of claim 4, wherein the drive gas flow is heated.

7. The rotor housing assembly of claim 6, wherein the drive gas flow is heated to a temperature of at least 200° C.

8. The rotor housing assembly of claim 1, wherein the temperature gradient within the sample space is 3° C. or less from an area of the internal sample space opposite the first heated gas flow inlet extending axially toward either the distal or proximal area of the internal sample space.

9. The rotor housing assembly of claim 1, wherein the first heated gas flow is heated to a temperature of up to 400° C.

10. The rotor housing assembly of claim 1, wherein the second heated gas flow is heated to a temperature of up to 200° C.

11. The rotor housing assembly of claim 1, wherein the first heated gas flow inlet is formed in a wall of the housing.

12. The rotor housing assembly of claim 1, wherein a flow path for the second heated gas flow comprises an inlet passage formed in a wall of the housing, a junction with one distally extending passage and one proximally extending passage, the distally extending passage and the proximally extending passage each terminating at a respective one of the second heated gas flow outlets.

13. The rotor housing assembly of claim 12, further comprising proximal and distal air bearings positioned to rotatably support the rotor, and wherein the second heated gas flow outlets are positioned adjacent the proximal and distal air bearings, respectively, and wherein the second heated gas flow comprises a heated bearing gas flow that supplies the proximal and distal air bearings and transfers heat from along the flow path and through the wall, and from the proximal and distal air bearings into the housing interior space.

14. The rotor housing assembly of claim 12, further comprising a dewar with a heating coil connected to supply the second heated gas flow to the inlet passage in the wall of the housing assembly.

15. The rotor housing assembly of claim 1, further comprising a surrounding shell having an exhaust opening, and wherein the first heated gas flow and the second heated gas flow are exhausted from the housing into the shell, further comprising a purge air flow pathway by which a purge air flow of cooling air is directed into the shell to mix with and cool exhausted first and second heated gas flows before they are exhausted from the shell.

16. The rotor housing assembly of claim 15, wherein the shell comprises an annular space by which air from an electronics area is exhausted.

17. The rotor housing assembly of claim 1, wherein the internal sample space of the rotor is capable of being pressurized up to 400 bar.

18. A method of operating an NMR probe at elevated temperatures, comprising:
   flowing a drive flow gas to impinge upon a drive end of a rotor having a sample space to drive the rotor in rotation about an axis, the drive flow gas being fed through a passage in a housing positioned radially outwardly of the rotor;
   flowing a first heated gas flow through an opening in the housing and towards the sample space of the rotor; and
   flowing a second heated gas flow in opposite directions toward opposite ends of the rotor;
   wherein the first heated gas flow and the second heated gas flow are controllable to reduce a temperature gradient extending axially along the sample space of the rotor.

19. The method of claim 18, wherein the temperature gradient extending axially along the sample space is 3° C. or less.

20. The method of claim 19, wherein the temperature gradient along the sample space of 3° C. or less is reached in five minutes or less of operation.

21. The method of claim 18, wherein the second heated gas flow comprises a bearing gas flow directed to air bearing areas to operate air bearings at opposite ends of the rotor to support the rotor during rotation.

22. The method of claim 18, comprising heating the first heated gas flow to an elevated temperature of up to 400° C.

23. The method of claim 18, comprising heating the second heated gas flow to an elevated temperature of up to 400° C.

24. The method of claim 18, further comprising heating the drive gas flow to assist in reducing the temperature gradient in the sample space.

25. A method of in situ NMR monitoring of a high temperature chemical process, comprising:
   spinning a rotor having a sample in space which a sample is contained to conduct a MAS NMR operation,
   heating the sample space within the rotor to a temperature above 250° C. with a first heated gas flow primarily directed at a first location of the rotor;
   maintaining a temperature gradient within the sample space of 3° C. or less using heat applied to the rotor at a second location spaced away from the first location; and
   monitoring in situ phase transitions occurring in the sample.

26. The method of claim 25, wherein the sample space is pressurized.

* * * * *